US006963218B1

(12) United States Patent
Alexander et al.

(10) Patent No.: US 6,963,218 B1
(45) Date of Patent: Nov. 8, 2005

(54) BI-DIRECTIONAL INTERFACE AND COMMUNICATION LINK

(75) Inventors: Mark A. Alexander, Boulder, CO (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 10/215,924

(22) Filed: Aug. 9, 2002

(51) Int. Cl.$^7$ ............................................. H03K 17/16
(52) U.S. Cl. .............................. 326/30; 326/26; 326/27
(58) Field of Search ........................ 326/37, 41, 30–34, 326/86, 90, 26, 27

(56) References Cited

U.S. PATENT DOCUMENTS

| | | | |
|---|---|---|---|
| 5,134,311 A | | 7/1992 | Biber et al. |
| 5,463,326 A | | 10/1995 | Raje |
| 5,506,541 A | | 4/1996 | Herndon |
| 5,559,441 A | | 9/1996 | Desroches |
| 5,877,632 A | * | 3/1999 | Goetting et al. .............. 326/50 |
| 5,949,268 A | | 9/1999 | Miura et al. |
| 6,087,847 A | | 7/2000 | Mooney et al. |
| 6,094,069 A | | 7/2000 | Magane et al. |
| 6,160,417 A | * | 12/2000 | Taguchi ....................... 326/30 |
| 6,218,863 B1 | * | 4/2001 | Hsu et al. ..................... 326/87 |
| 6,232,814 B1 | | 5/2001 | Douglas, III |
| 6,278,300 B1 | * | 8/2001 | Urakawa .................... 327/112 |
| 6,380,758 B1 | * | 4/2002 | Hsu et al. ..................... 326/30 |
| 6,414,525 B2 | * | 7/2002 | Urakawa .................... 327/112 |
| 6,445,245 B1 | * | 9/2002 | Schultz et al. .............. 327/541 |
| 6,480,026 B2 | * | 11/2002 | Andrews et al. .............. 326/39 |
| 6,480,798 B2 | * | 11/2002 | Lee ............................ 702/107 |
| 6,549,036 B1 | * | 4/2003 | Lee ............................. 326/83 |

FOREIGN PATENT DOCUMENTS

EP          0978943 A2    2/2000

OTHER PUBLICATIONS

Thaddeus J. Gabara and Scott C. Knauer, "Digitally Adjustable Resistors in CMOS for High-Performance Applications" IEEE Journal of Solid State Circuits, vol. 27, No. 8, Aug. 1992.
Aris Balatsos and David Lewis, "TA 10.4 Low-Skew Clock Generator with Dynamic Impedance and Delay Matching" IEEE International Solid State Circuits Conference, 1999.
Toshiro Takahashi et al, "TA 10.1 110GB/s Simultaneous Bi-Directional Transceiver Logic Synchronized with a System Clock" IEEE International Solid State Circuits Conference, 1999.
Sai Vishwanthaiah et al, "TP 15.1 Dynamic Termination Output Driver for a 600MHZ Microprocessor" IEEE International Solid State Circuits Conference, 2000.

* cited by examiner

*Primary Examiner*—Anh Q. Tran
(74) *Attorney, Agent, or Firm*—W. Eric Webostad; Edel M. Young; Justin Liu

(57) ABSTRACT

Method and apparatus for a bi-direction interface and communication link are described. More particularly, an input/output block is formed with a digitally controlled impedance output driver output coupled at an input/output node to an input terminal of a differential amplifier. Another terminal of the differential amplifier is used for inputting a reference voltage. As the digitally controlled impedance output buffer may be adjusted for impedance matching with transmission line impedance, no parallel terminating resistance is needed. Accordingly, two such input/output blocks may be coupled to form a bi-directional communication link with the advantage of an absence of parallel termination resistance at inputs to such input/output blocks.

18 Claims, 14 Drawing Sheets

BI-DIRECTIONAL INTERFACE AND COMMUNICATION LINK

RELATED PATENT APPLICATION

The present invention relates to U.S. patent application Ser. No. 08/837,023 filed by Goetting et al. on Apr. 11, 1997 and entitled "FPGA with a Plurality of I/O Voltage Levels", the contents of which are incorporated herein by reference.

FIELD OF THE INVENTION

One or more aspects of the invention generally relate to a bi-directional interface, and more particularly to a high-speed, low-voltage bi-directional interface with digitally controlled output impedance.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBS, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

In a complementary metal oxide ("CMOS") configured IOB, a buffer conventionally is of a "push-pull" configuration. A push-pull configuration is where a p-channel transistor is coupled in series with an n-channel transistor, usually between power and ground, to either push current from a power terminal into a middle node or pull current from the middle node into the ground terminal. Unfortunately, p-type transistors and n-type transistors may not have the same resistivity. This can cause asymmetry between rise and fall times for going from a high logic level voltage to a low logic level voltage and vice versa. Moreover, this asymmetry in resistivity of n-type and p-type transistors is not only semiconductor process dependent, but is subject to change due to changes in environmental conditions, especially extreme temperatures.

To compensate for differences between n-type and p-type transistor resistivity, others have created a digitally controlled impedance buffer. In a digitally controlled impedance buffer a different number of p-channel and n-channel transistors are selected in order to compensate for asymmetry in rise and fall time output waveforms from a buffer.

A limitation of CMOS is needed voltage levels. For example, CMOS voltage separation of 1.5 volts between power and ground conventionally requires an input voltage of no more than 0.2 volts to read a logic 0 and no less than 1.3 volts to read a logic 1. Thus, there is a certain time consumed in going from high to low or low to high voltage levels, or what is known as going "rail-to-rail".

In order to achieve high data rates, such as approximately two hundred megabits per second and greater, others have implemented high-speed interfaces. Examples of such interfaces include high-speed transceiver logic (HSTL) and stubs series transceiver logic (SSTL), among others. HSTL and SSTL both use parallel termination. In order to avoid reflection of signals caused by an impedance mismatch between an FPGA output and a printed circuit board (PCB) to which such an FPGA was attached, parallel termination resistors were needed.

However, it is possible to operate a narrow voltage swing for a higher resulting data rate in one direction, for example, unidirectionally from a digitally controlled impedance buffer driver to an HSTL receiver over a link, without parallel termination resistance. This approach requires two unidirectional links to provide the bi-directional communication. This approach therefore uses additional dedicated traces, as well as additional input and output pins, as compared with a single bi-directional communication link. It is also possible to operate a single bi-directional communication link with narrow voltage swings with bi-directional IOBs using parallel termination resistance.

Parallel termination resistance, though reducing reflection of an output from an integrated circuit, introduced negative effects, namely, signal attenuation. Notably, signal attenuation limits the degree to which CMOS voltage levels may be reduced and still meet narrow voltage swing thresholds. Sometimes, conventional parallel termination for a bi-directional communication link is done externally to an integrated circuit, and thus an integrated circuit attached to a PCB would have to have an external resistance matched to the transmission line impedance for each I/O pin. Moreover, conventional CMOS drivers that are not adjustable for n-channel and p-channel transistor selection for impedance trimming conventionally exhibit asymmetrical signal rise and fall times. This asymmetry causes duty cycle distortion and can limit the data rate at which a link can effectively operate. Schultz et al. in U.S. patent application Ser. No. 09/684,539 describe a "Digitally Controlled Impedance for I/O of an Integrated Circuit Device" in which impedance is digitally controlled and matched to an external impedance, but in which no external terminal resistors are used. But the disadvantages of termination resistance are still present.

Accordingly, it would be both desirable and useful to provide an IOB that allows operation in a bi-directional mode that does not suffer from limitations associated with parallel termination resistance. Moreover, it would be further desirable and useful if such an IOB did not need external or internal parallel termination resistance.

SUMMARY OF THE INVENTION

An aspect of the invention is a high-speed low voltage transceiver. A digitally controlled impedance buffer has an input node and an output node. A differential amplifier has a first input terminal and a second input terminal, where the differential amplifier is coupled to the digitally controlled impedance buffer. The first input terminal is coupled to the output node.

Another aspect of the invention is a bi-directional communication link. A printed circuit board has a first integrated circuit with a first input/output block and a second integrated circuit with a second input/output block. The first integrated circuit is coupled to the second integrated circuit via the printed circuit board for bi-directional communication, where the first input/output block may be put in communication with the second input/output block. Each of the first and second input/output blocks includes: a digitally controlled impedance buffer having an input node and an output node, and a differential amplifier having a first input terminal and a second input terminal. The differential amplifier is coupled to the digitally controlled impedance buffer, where the first input terminal is coupled to the output node.

Another aspect of the invention is a method for bi-directional communication. An output signal is received. The output signal is buffered to an input/output node, where the output signal is limited to a first voltage swing responsive to the buffering including adjusting series impedance for impedance matching. A reference voltage is provided to an input node. An input signal is received at the input/output node, where the input signal is limited to a second voltage swing. A difference between the reference voltage and the input signal voltage is amplified.

BRIEF DESCRIPTION OF THE DRAWINGS

So that the manner in which the above recited features and advantages of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

Figure 1:
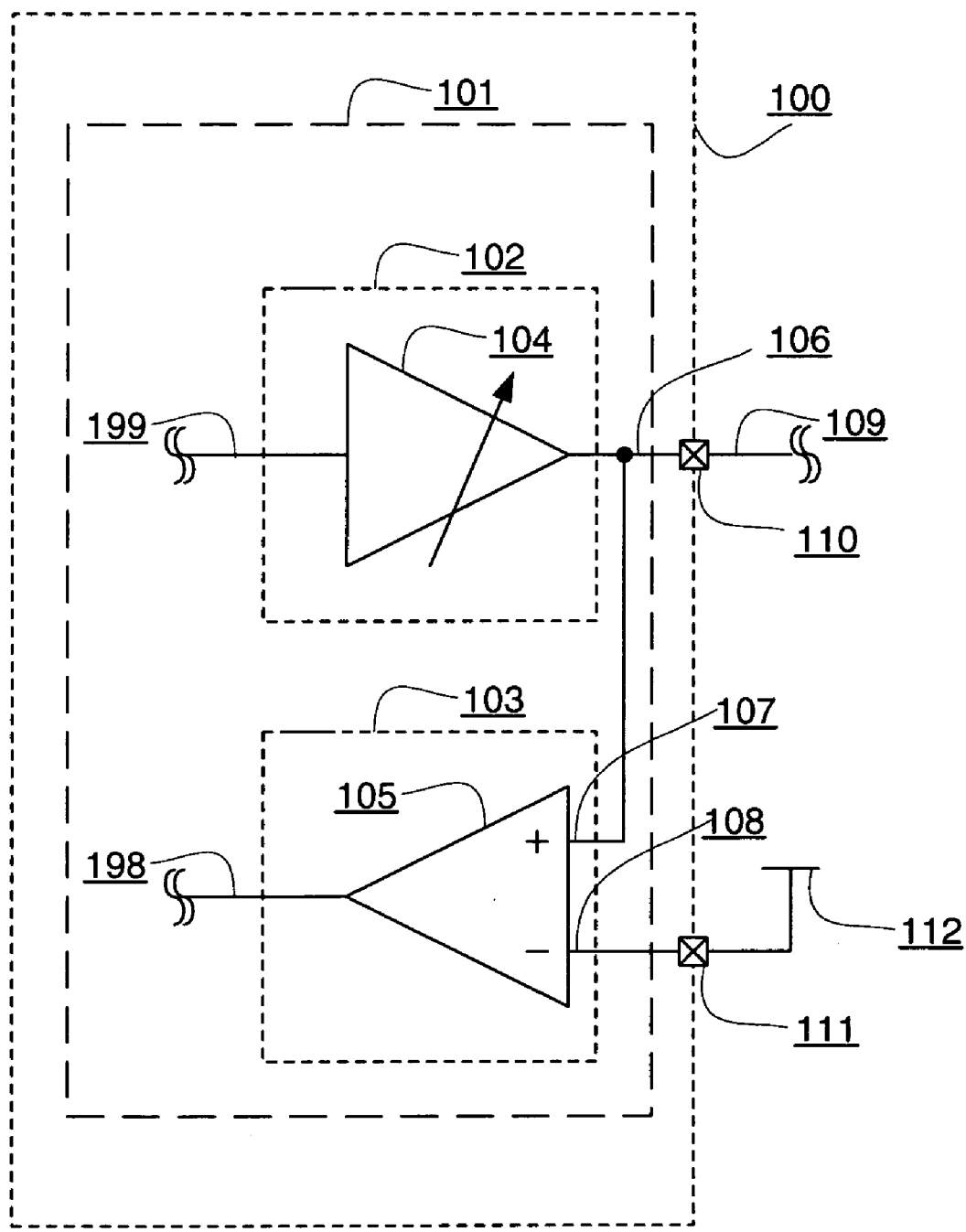
FIG. 1 is a schematic diagram of an exemplary embodiment of an integrated circuit in accordance with one or more aspects of the present invention.

FIG. 1 is a schematic diagram of an exemplary embodiment of a driving device 102 and a receiving device 103 in accordance with one or more aspects of the present invention. Driving device or driver 102 and receiving device or receiver 103 may form at least a portion an IOB 101, which may form a portion of an integrated circuit 100.

Driver 102 includes digitally controlled impedance (DCI) output buffer 104. Receiver 103 comprises differential amplifier 105. I/O node 106 is an output node for DCI output buffer 104 and an input node for differential amplifier 105. Differential amplifier 105 comprises input terminals 107 and 108. Though a positive polarity input terminal 107 is shown coupled to I/O node 106, input terminal 107 may be a negative polarity terminal depending on voltage logic convention. However, for purposes of clarity, it will be assumed that terminal 107 is for positive polarity.

I/O node 106 is used to couple DCI output buffer 104 to I/O pin 110 of integrated circuit 100. I/O node 106 is further used to couple input terminal 107 of differential amplifier 105 to I/O pin 110. I/O pin 110 may be connected to a transmission line 109. Transmission line 109 may be a trace or a bus of a printed circuit board.

Input pin 111 of integrated circuit 100 couples differential amplifier 105 to reference voltage, $V_{ref}$, 112. Reference voltage 112 may be for an HSTL, SSTL or other well known high-speed single-ended I/O interface. Such high-speed interfaces may be found in a variety of integrated circuit applications, including, but not limited to, interfacing to random access memory and accelerated graphics ports, among other known interfaces. Input at terminal 107 is compared with reference voltage 112 at terminal 108 to provide input signal 198.

An output signal 199 to be outputted from integrated circuit 100 is provided to DCI output buffer 104. Additional details regarding DCI output buffer 104 as described by others is provided below for reference under the subheading DCI Buffer. Because DCI output buffer 104 has adjustable impedance, it will be used to compensate for semiconductor process differences, as well as to compensate for differences due to operational characteristics such as temperature and voltage. In particular, n-channel and p-channel transistors may be selected to provide a particular impedance. This allows output I/O node 106 of output signal 199 to have at least approximately symmetrical rise and fall characteristics, such as rise and fall times.

However, in addition to compensation for asymmetry between n-channel and p-channel transistors, impedance of DCI output buffer 104 is adjusted to a least approximately match impedance of transmission line 109. Impedance of transmission line 109 may come from inherent impedance associated with traces of a printed circuit board, as well as a termination resistance coupled to transmission line 109 for an integrated circuit other than integrated circuit 100. Integrated circuit 100 may be coupled to a conventional integrated circuit that uses conventional termination resistance, such as a transistor or a resistor, whether internal or external to such integrated circuit.

With continuing reference to a driving device 102 of bi-directional IOB 101, controlling or adjusting impedance of DCI output buffer 104 to at least approximately match transmission line 109 impedance results in an output waveform that exhibits reduced reflection. Additionally, with such impedance adjustment or control, no external or internal parallel termination resistance is needed for bi-directional buffer 101. Moreover, because p-channel and n-channel devices of DCI output buffer 104 may be independently trimmed, these p-channel and n-channel transistors may be separately trimmed to match impedance of transmission line 109. Thus, additional flexibility in having dissimilar adjustments is provided.

Figure 2:
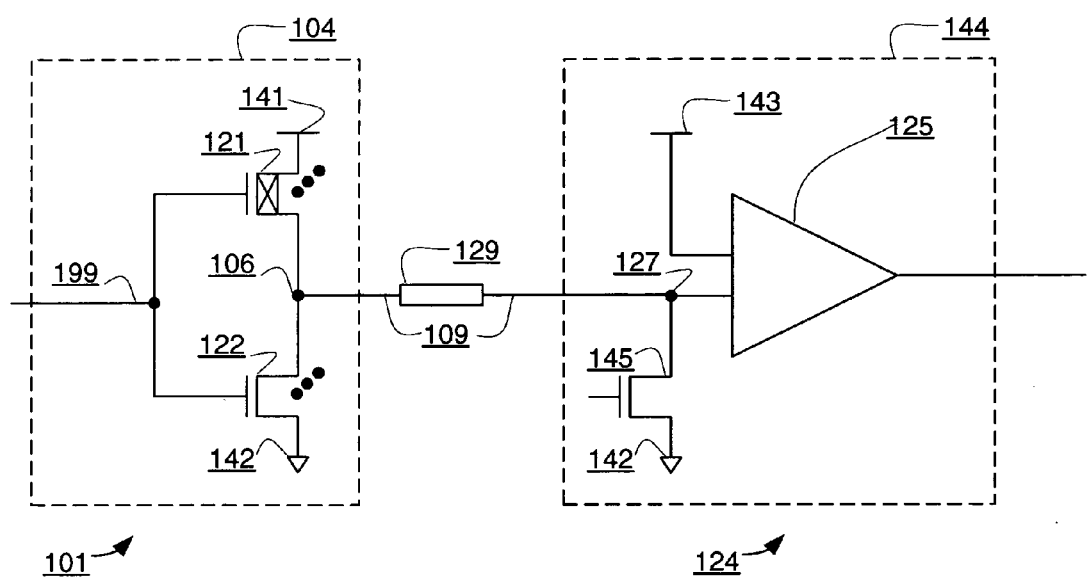
FIG. 2 is a schematic diagram of an exemplary embodiment of an output driver of the integrated circuit of FIG. 1 coupled to a conventional transceiver.

FIG. 2 is a schematic diagram of an exemplary embodiment of transceiver 101 of FIG. 1 coupled to a conventional HSTL/SSTL transceiver 124 via a transmission line 109 for the output portion of a bi-directional communication link. For simplicity, transmission line impedance 129 is shown as a box. Moreover, for simplicity, only an output driver portion 104 of transceiver 101 and a receiver portion 144 of transceiver 124 are shown. Output signal 199 is provided to output driver 104, which is a CMOS output driver as indicated by p-channel transistors 121 and n-channel transistors 122. As mentioned above, a number of transistors 121 and 122 are each independently selected for trimming output impedance to be approximately equal to transmission line impedance 129.

P-channel transistors 121 are coupled between a logic high voltage level, such as Vcc 141, and input/output node 106. N-channel transistors 122 are coupled between a logic low voltage level, such as Vss 142, and input/output node 106. Output signal 199 is applied to gates of transistors 121 and 122. Accordingly, a push-pull configuration is achieved.

A conventional HSTL/SSTL receiver 144 is coupled to output driver 104 via transmission line 109. A reference voltage 143 is provided to one input terminal of differential amplifier 125 and output signal 199, and output from output driver 104 at node 106 is provided to input node 127 over transmission line 109. Input node 127 is coupled to another input terminal of differential amplifier 125 and coupled to a termination resistance, as provided by transistor 145. Accordingly, output driver 104 may be coupled to a conventional HSTL/SSTL receiver 144, though signal loss due to parallel termination resistances occurs. Loss of signal due to terminating resistance, in addition to any signal loss due to transmission line 109, limits the degree to which CMOS voltage levels may be reduced and still be discerned by differential amplifier 125.

Notably, a dedicated HSTL/SSTL receiver could be used, namely a receiver and not a transceiver, but then a communication link between output driver 104 and such a receiver would be a unidirectional link and not a bi-directional link, which costs significant semiconductor and PCB area, including additional associated complexities.

Figure 3A:
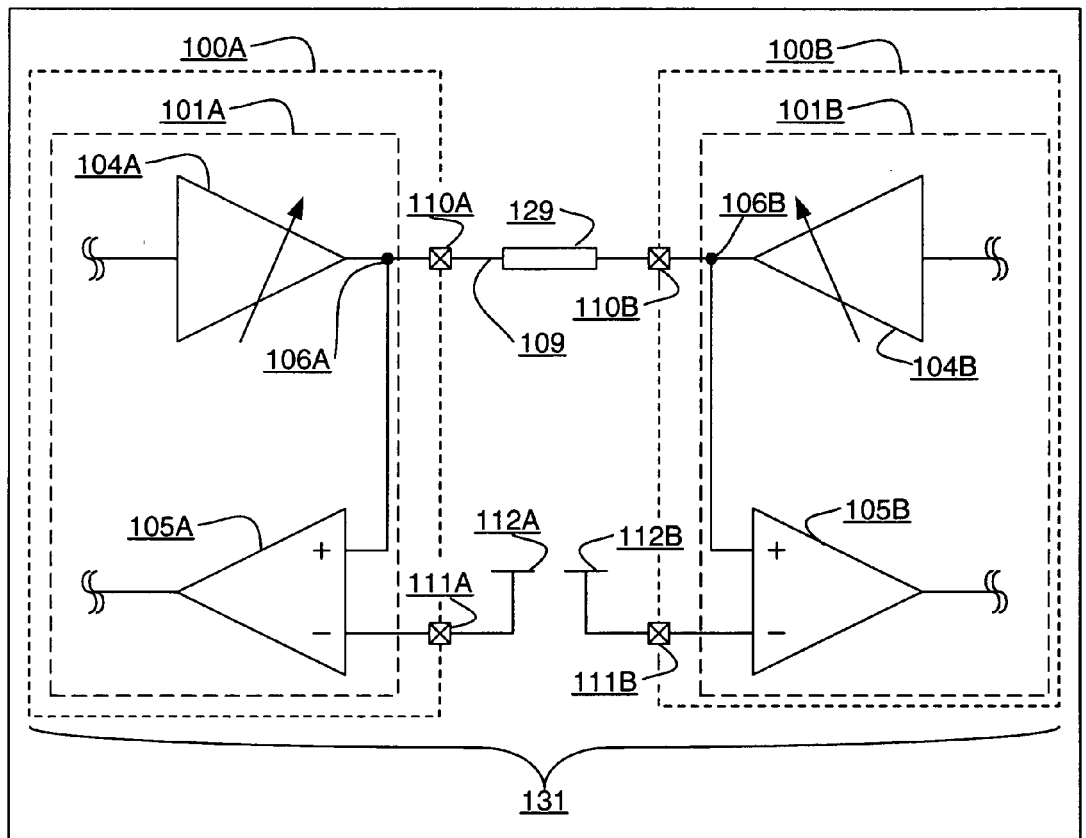
FIG. 3A is a schematic diagram of a bi-directional communication link in accordance with one or more aspects of the present invention.

FIG. 3A is a schematic diagram of a bi-directional communication link 131 in accordance with one or more aspects of the present invention. Integrated circuit 100A is coupled to integrated circuit 100B via transmission line 109. All elements of integrated circuits 10A and 100B were described with respect to FIG. 1, and thus are not repeated here. Such elements have been relabeled with an "A" or a "B" for purposes of clarity. Notably, reference voltages 112A and 112B may be dedicated levels or user selectable depending on application, and may be the same or different voltages depending on application. In one embodiment, these levels are in a range of approximately 100 millivolts above and below the reference voltage.

Integrated circuit 100A and 100B may be attached to a printed circuit board 130, where PCB 130 comprises one or more transmission lines 109 in the form of traces or buses. It should be apparent that there is no termination resistance in bi-directional communication link 131. However, for purposes of clarity, more detailed schematics in FIGS. 3B through 3D are shown.

Figure 3B:
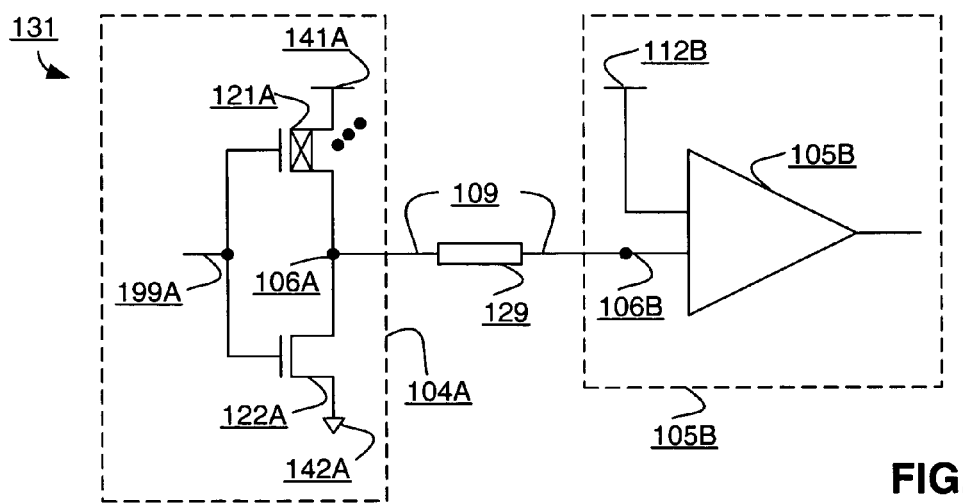
FIG. 3B is a schematic diagram of an output driver portion of the bi-directional communication link of FIG. 3A.

FIG. 3B is a schematic diagram of an output driver portion of bi-directional communication link 131 of FIG. 3A. For purposes of clarity, only one output driver and one receiver are shown, as the other transmission direction would be the same. As shown, there is no termination resistance, whether in the form of a transistor, resistor or other resistive configuration, coupled at node 106B.

Figure 3C:
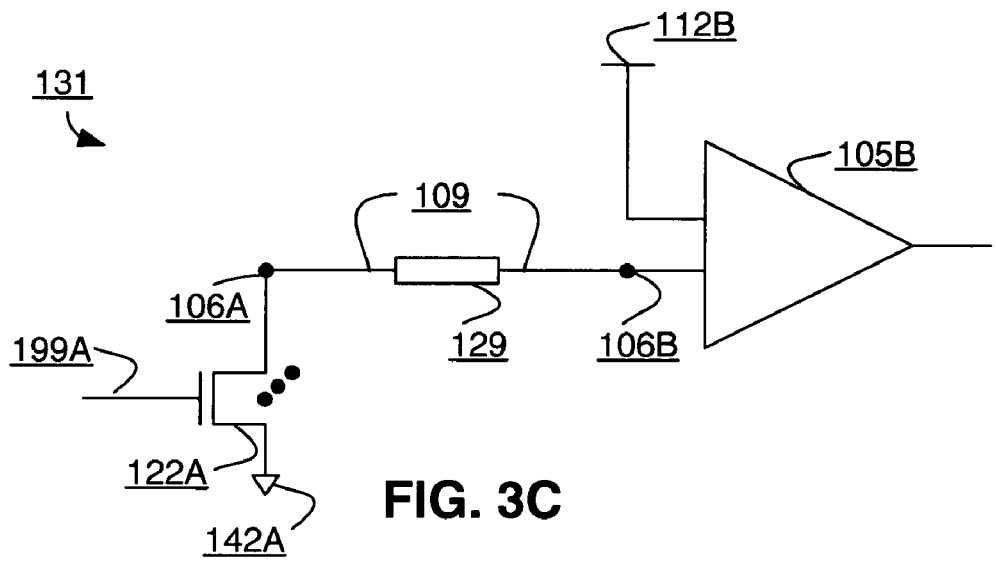
FIG. 3C is a schematic diagram of a low voltage output of the output driver portion of FIG. 3B.

FIG. 3C is a schematic diagram of a low voltage output of a portion of output driver 124A of FIG. 3B. When output signal 199A is active high, transistors 121A of FIG. 3B are off, and transistors 122A are in a conductive state to drive voltage at node 106A toward Vss 142A, or output-low voltage VOL at input/output node 106A.

Figure 3D:
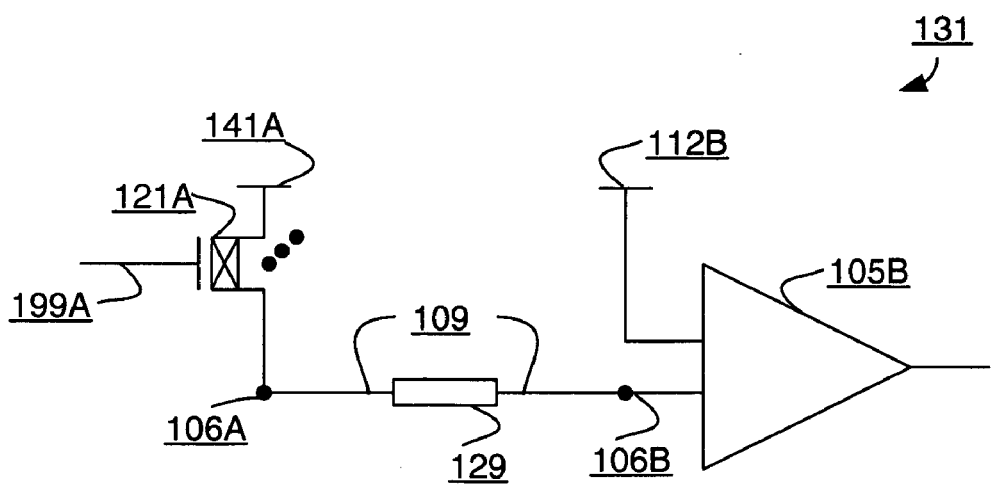
FIG. 3D is a schematic diagram of a high voltage output of the output driver portion of FIG. 3B.

FIG. 3D is a schematic diagram of a high voltage output of the output driver portion of FIG. 3B. When output signal 199A is active low, transistors 122A of FIG. 3B are off, and transistors 121A are in a conductive state to drive voltage at node 106A toward Vcc 141A, or output-high voltage $V_{OH}$ at input/output node 106A.

Figure 4:
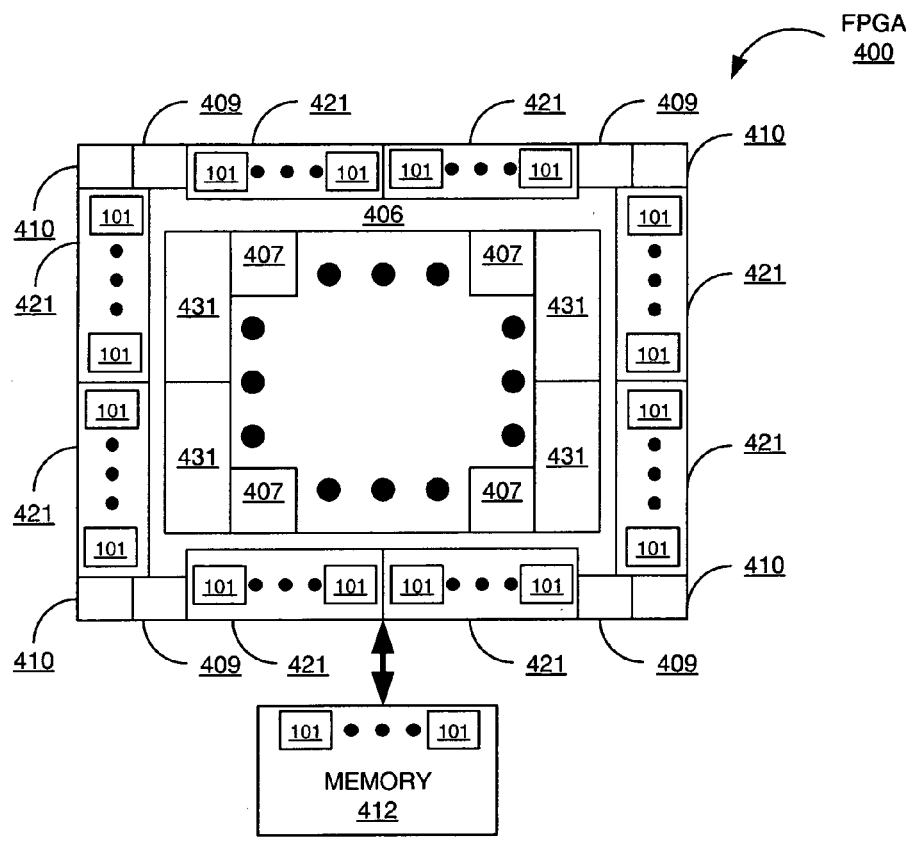
FIG. 4 is a block diagram of an exemplary embodiment of an FPGA in accordance of one or more aspects of the invention coupled to program memory.

FIG. 4 is a block diagram of an exemplary embodiment of an FPGA 400 in accordance of one or more aspects of the invention coupled to memory 412. FPGA 400 comprises CLBs 407, I/O routing ring 406, memory, such as random access memory 431, delay lock loops (DLLs) 409, multiply/divide/de-skew clock circuits 410, and programmable IOBs 421. Programmable IOBs 421 comprise one or more IOBs 101, as previously described. Memory 412 may comprise one or more IOBs 101 for high-speed bi-directional communication with FPGA 400.

Figure 5:
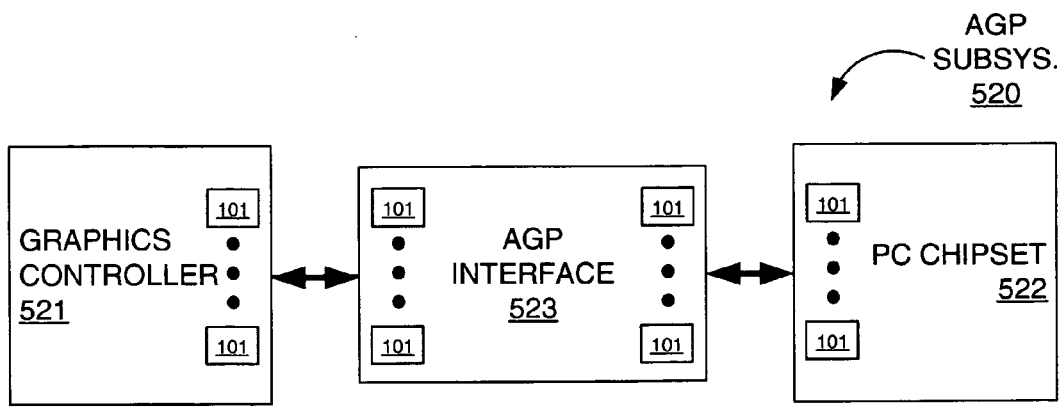
FIG. 5 is a block diagram of an exemplary implementation of an accelerated graphics port (AGP) in accordance with one or more aspects of the present invention.

FIG. 5 is a block diagram of an exemplary implementation of an accelerated graphics port (AGP) subsystem 520 in accordance with one or more aspects of the present invention. AGP interface 523 is coupled to graphics controller 521 and to one or more integrated circuits of a chipset, such as a personal computer (PC) chipset 522. One or more integrated circuits of PC chipset 522 may comprise one or more IOBs 101 for high-speed bi-directional communication with one or more IOBs of AGP interface 523. Graphics controller 521 may comprise one or more IOBs 101 for high-speed bi-directional communication with one or more IOBs of AGP interface 523.

DCI Buffer

Figure 6:
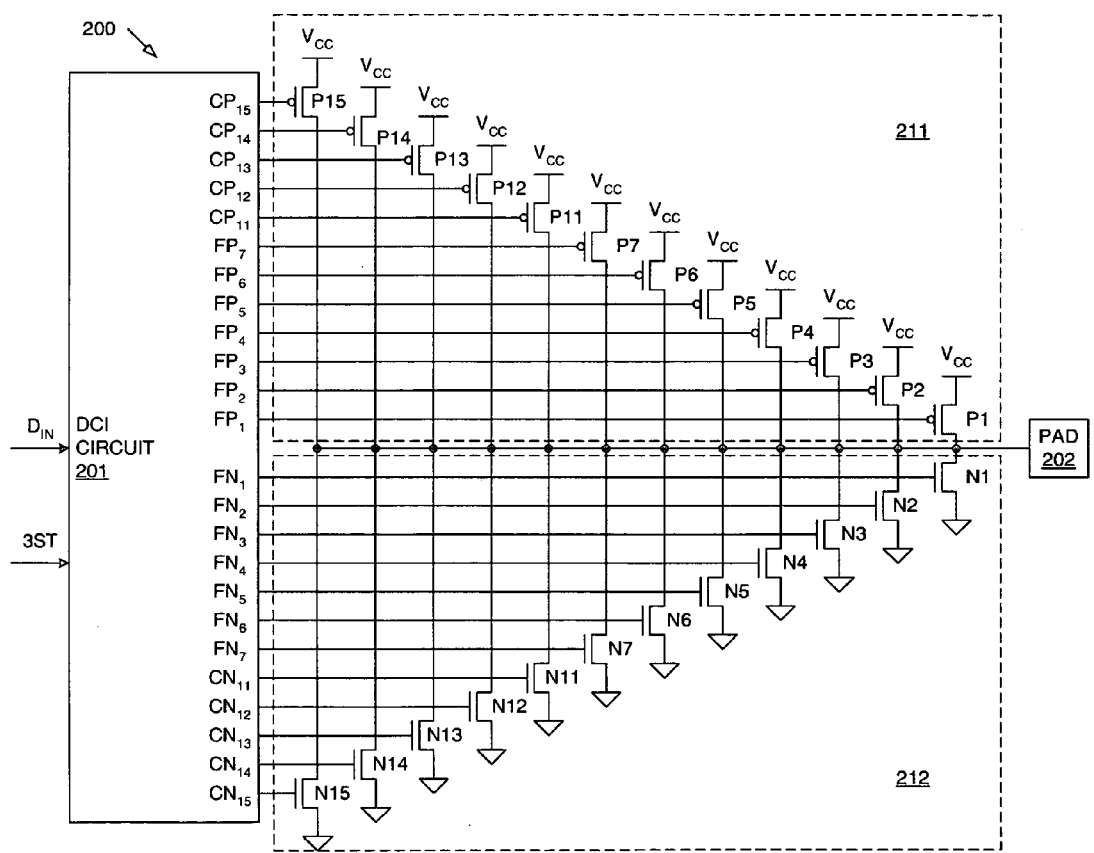
FIG. 6 is a circuit diagram of an output driver circuit with digitally adjustable impedance.

FIG. 6 is a circuit diagram of an output driver 200. Output driver 200 includes digitally controlled impedance (DCI) circuit 201, p-channel pull-up transistors P1–P7 and P11–P15, n-channel pull-down transistors N1–N7 and N11–N15, and I/O pad 202. P-channel pull-up transistors P1–P7 and P11–P15 are collectively referred to as p-channel transistors 211, and n-channel pull-down transistors N1–N7 and N11–N15 are collectively referred to as n-channel transistors 212. In other embodiments, other combinations of transistors can be used.

As described in more detail below, p-channel transistors P1–P7 are used as "fine-adjustment" transistors, each having an on-conductance of "$Y_P$" siemens. Similarly, n-channel transistors N1–N7 are used as "fine-adjustment" transistors, each having an on-conductance of "$Y_N$" siemens. P-channel transistors P11–P15 are used as "coarse-adjustment" transistors, having on-conductances of $1X_P$, $2X_P$, $4X_P$, $8X_P$ and $16X_P$ siemens, respectively. N-channel transistors N11–N15 are also used as "coarse-adjustment" transistors, having on-conductances of 1XN, 2XN, 4XN, 8XN and 16XN siemens, respectively. In the described embodiment, $Y_P$ is approximately equal to $X_P$, and $Y_N$ is approximately equal to $X_N/2$. In other embodiments, other conductance values can be used.

Each of fine p-channel transistors P1–P7 and coarse p-channel transistors P11–P15 has a source coupled to a $V_{CC}$ voltage supply terminal. Each of fine n-channel transistors N1–N7 and coarse n-channel transistors N11–N15 has a source coupled to a ground voltage supply terminal. The drains of transistors P1–P7, P11–P15, N1–N7 and N11–N15 are coupled to I/O pad 202.

The gates of fine p-channel transistors P1–P7 are coupled to receive control signals $FP_1$—$FP_7$, respectively, from DCI circuit 201. Similarly, the gates of coarse p-channel transistors P11–P15 are coupled to receive control signals $CP_{11}$–$CP_{15}$, respectively, from DCI circuit 201.

The gates of fine n-channel transistors N1–N7 are coupled to receive control signals $FN_1$—$FN_7$, respectively, from DCI circuit 201. Similarly, the gates of coarse n-channel transistors N11–N15 are coupled to receive control signals $CN_{11}$–$CN_{15}$, respectively, from DCI circuit 201.

DCI circuit 201 is configured to receive a data input signal DIN and a tri-state signal 3ST, each having a logic high or logic low value. In general, if signal 3ST has a logic low value (i.e., driver 200 is not tri-stated) and the DIN signal has a logic low value, DCI circuit 201 asserts one or more of the control signals $FP_1$—$FP_7$, $CP_{11}$–$CP_{15}$ to a logic low value, thereby turning on one or more of p-channel transistors P1–P7, P11–P15. The turned on p-channel transistors are selected in a manner described in more detail below. DCI circuit 201 also provides logic low control signals $FN_1$–$FN_7$, $CN_{11}$–$CN_{15}$, thereby turning off all of n-channel transistors N1–N7 and N11–N15. As a result, pad 202 is coupled to the $V_{CC}$ voltage supply terminal through the turned-on p-channel transistors. DCI circuit 201 selects the turned-on p-channel transistors to provide a particular resistance between the $V_{CC}$ voltage supply terminal and pad 202.

If the 3ST signal has a logic high value, then output driver circuit 200 is tri-stated and will generally not drive pad 202. However, if output driver circuit 200 is used to provide a transmission line termination (as described in more detail below), then output driver circuit 200 will be configured to turn on a combination of n-channel and/or p-channel transistors to provide the appropriate transmission line termination resistance. In this case, the 3ST signal has no affect on the line termination.

In the examples described below, coarse p-channel transistors P11–P15 are enabled in a binary count order to provide a coarse resistance adjustment. Fine p-channel transistors P1–P7 are then enabled or disabled to provide a fine resistance adjustment. For example, fine p-channel transistors P1–P3 and coarse p-channel transistor P13 may be turned on when the DIN signal has a low value. In this example, the equivalent conductance of the p-channel portion of output driver circuit 200 would be equal to $X_P+X_P+X_P+4X_P$, or $7X_P$, siemens.

If 3ST signal has a logic low value and the DIN signal has a logic high value, then DCI circuit 201 asserts one or more of the control signals $FN_1$–$FN_7$, $CN_{11}$–$CN_{15}$ to a logic high value, thereby turning on one or more of n-channel transistors N1–N7, N11—N15. The turned on n-channel transistors are selected in a manner described in more detail below. DCI circuit 201 also provides logic high control signals $FP_1$–$FP_7$, $CP_{11}$–$CP_{15}$, thereby turning off all of p-channel transistors P1—P7 and P11–P15. As a result, pad 202 is coupled to the ground terminal through the turned-on n-channel transistors. DCI circuit 201 selects the turned-on n-channel transistors to provide a particular resistance between the ground terminal and pad 202.

In the examples described below, the coarse n-channel transistors N11–N15 are turned on in a binary count order to provide a coarse resistance adjustment. Fine n-channel transistors N1–N7 are then enabled or disabled to provide a fine resistance adjustment. For example, fine n-channel transistors N1—N2 and coarse n-channel transistors N11 and N14 may be turned on when the DIN signal has a high value. In this example, the equivalent conductance of the n-channel portion of output driver circuit 200 would be equal to $X_N/2+X_N/2+X_N+8X_N$, or $10X_N$ siemens.

A chip will include a plurality of output driver circuits identical to output driver circuit 200. In general, one output driver circuit is selected to be a p-channel reference circuit, which is used to determine which p-channel transistors must be turned on to provide a desired resistance for a logic high output value or a desired transmission line termination. Similarly, one output driver circuit is selected to be an n-channel reference circuit, which is used to determine which n-channel transistors must be turned on to provide a desired resistance for a logic low output value or a desired transmission line termination. The determinations made by the p-channel and n-channel reference circuits are then transmitted to, and used by, other active output driver circuits.

Figure 7:
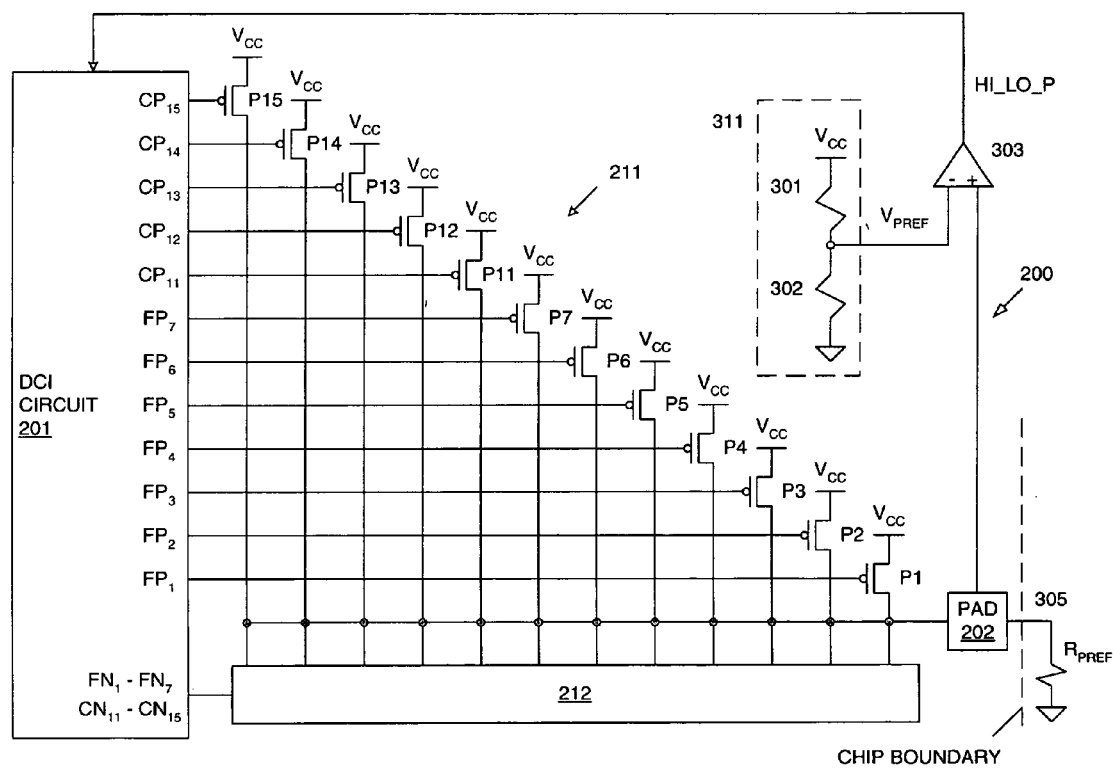
FIG. 7 is a circuit diagram illustrating the general manner in which p-channel transistors of an output driver circuit are matched with an external resistance.

FIG. 7 is a circuit diagram illustrating the general manner in which p-channel transistors P1–P7 and P11–P15 of output driver circuit 200 are controlled with respect to an external resistance 305. That is, FIG. 7 illustrates output driver circuit 200 being used as a p-channel reference circuit. As shown in FIG. 7, external resistor 305, having a resistance of $R_{PREF}$, is coupled between pad 202 and ground. Internally, pad 202 is also coupled to a positive input terminal of comparator 303. The negative input terminal of comparator 303 is coupled to receive a p-channel reference voltage $V_{PREF}$ from a reference voltage generator 311. In the described example, reference voltage generator 311 includes a pair of resistors 301–302 connected in series between the $V_{CC}$ voltage supply and the ground supply. Resistors 301–302 are connected at a common node, which provides the $V_{PREF}$ voltage. In the described example, resistors 301–302 each have a resistance of R ohms. As a result, the reference voltage $V_{PREF}$ has a value of approximately $V_{CC}/2$. The voltage on pad 202 will exhibit a voltage of approximately $V_{CC}/2$ when the equivalent on-resistance of the enabled p-channel transistors 211 is approximately equal to the resistance $R_{PREF}$ of reference resistor 305. In other examples, other resistance values and ratios can be used for resistors 301 and 302.

DCI circuit 201 operates as follows. Initially, all of the p-channel transistors P1–P7 and P11–P15 are turned off. As a result, the voltage on pad 202 is pulled down to a voltage less than the reference voltage $V_{PREF}$. As a result, comparator 303 provides a logic low HI_LO_P output signal.

DCI circuit 201 then asserts logic low control signals $FP_1$–$FP_3$, thereby turning on fine p-channel transistors P1–P3 ($3X_P$ siemens). If the equivalent resistance of fine p-channel transistors P1–P3 is greater than the resistance $R_{PREF}$, then the voltage on pad 202 will be less than the reference voltage $V_{PREF}$. As a result, comparator 303 will provide a logic low HI_LO_P output signal.

In response, DCI circuit 201 asserts a logic low control signal $CP_{11}$, thereby turning on coarse p-channel transistor $P_{11}$ ($X_P$ siemens) (along with fine p-channel transistors P1–P3).

Note that fine p-channel transistors P1–P7 are set near the midpoint of their range by initially turning on three of these transistors P1–P3 while the coarse p-channel transistors are selected. This enables the fine p-channel transistors P1–P7 to maintain an appropriate operating range when the resistance needs to be increased or decreased.

If the equivalent resistance of fine p-channel transistors P1–P3 and coarse p-channel transistor P11 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 de-asserts coarse control signal $CP_{11}$ (high), and asserts coarse control signal $CP_{12}$ (low), thereby turning on coarse p-channel transistor P12 ($2X_P$ siemens) (along with fine p-channel transistors P1–P3).

If the equivalent resistance of fine p-channel transistors P1–P3 and coarse p-channel transistor P12 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 asserts both coarse control signals $CP_{11}$ and $CP_{12}$ (low), thereby turning on coarse p-channel transistors P11–P12 ($3X_P$ siemens) (along with fine p-channel transistors P1–P3).

This sequence continues, with coarse p-channel transistors P11–P15 being turned on in a binary count order (e.g., $1x_P$, $2X_P$, $3X_P$, $4X_P$, $5X_P$, $6X_P$ . . . ) until the equivalent resistance of fine p-channel transistors P1–P3 and the enabled coarse p-channel transistors is less than the reference resistance $R_{PREF}$. At this time, the voltage on pad 202 will be greater than reference voltage $V_{PREF}$, thereby providing a logic high HI_LO_P signal. In response, DCI circuit 201 returns the coarse p-channel transistors to the binary count prior to the binary count that caused the HI_LO_P signal to go high.

For example, if the equivalent resistance of fine p-channel transistors P1–P3 and coarse p-channel transistors P12 and P13 ($6X_P$) is less than reference resistance $R_{PREF}$, then a logic high HI_LO_P signal will be generated. In response, DCI circuit 201 de-asserts control signal $CP_{12}$ (high), thereby turning off coarse p-channel transistor P12. DCI circuit 201 also asserts a logic low control signals $CP_{11}$ and $CP_{13}$, thereby turning on coarse p-channel transistors P11 and P13 ($5X_P$). Coarse p-channel transistors P11 and P13 are thereby selected to be the only turned-on coarse p-channel transistors for the duration of the present operating scheme. All further adjustments in the on-resistance of p-channel transistors 211 are made by enabling and disabling fine p-channel transistors P1–P7.

After the coarse adjustment described above, if coarse p-channel transistors P11 and P13 and fine p-channel transistors P1–P3 present an equivalent resistance that is greater than reference resistance $R_{PREF}$, comparator 303 again provides a logic low HI_LO_P signal to DCI circuit 201. Because the coarse transistors P11 and P13 have been set, DCI circuit 201 will only adjust the fine p-channel transistors at this time. Thus, DCI circuit 201 asserts the $FP_4$ control signal (in addition to the $FP_1$—$FP_3$, $CP_{11}$ and $CP_{13}$ signals), thereby turning on fine p-channel transistor P4 (in addition to fine p-channel transistors P1—P3 and coarse p-channel transistors P11 and P13). If the equivalent resistance of p-channel transistors P1–P4, P11 and P13 is less than reference resistance $R_{PREF}$, then comparator 303 will provide a high HI_LO_P signal. In response, DCI circuit 201 will subsequently turn off fine p-channel transistor P4.

If the equivalent resistance of fine p-channel transistors P1–P4 and coarse p-channel transistors P11 and P13 is greater than reference resistance $R_{PREF}$, then comparator 303 will again provide a low HI_LO_P output signal. In response, DCI circuit 201 will assert the $FP_5$ signal (in addition to the $FP_1$–$FP_4$, $CP_{11}$ and $CP_{13}$ signals), thereby turning on fine p-channel transistor P5 (in addition to fine p-channel transistors P1–P4 and coarse p-channel transistors P11 and P13). If the equivalent resistance of p-channel transistors P1–P5, P11 and P13 is less than (or greater than) reference resistance $R_{PREF}$, then comparator 303 will provide a high (or low) HI_LO_P output signal. Operation continues in this manner, with the fine p-channel transistors being adjusted as required. As a result, the equivalent resistance of the turned on p-channel transistors will have a predetermined relationship with respect to the reference resistance $R_{PREF}$. Advantageously, the number of turned on p-channel transistors will be further modified in response to the operating conditions of the system (e.g., changes in temperature and/or voltage) to maintain the equivalent resistance.

As described in more detail below, information identifying the enabled transistors in the p-channel reference circuit (FIG. 7) is transmitted to other output driver circuits, such that these other output driver circuits are operated by enabling the same transistors as the p-channel reference circuit.

Figure 8:
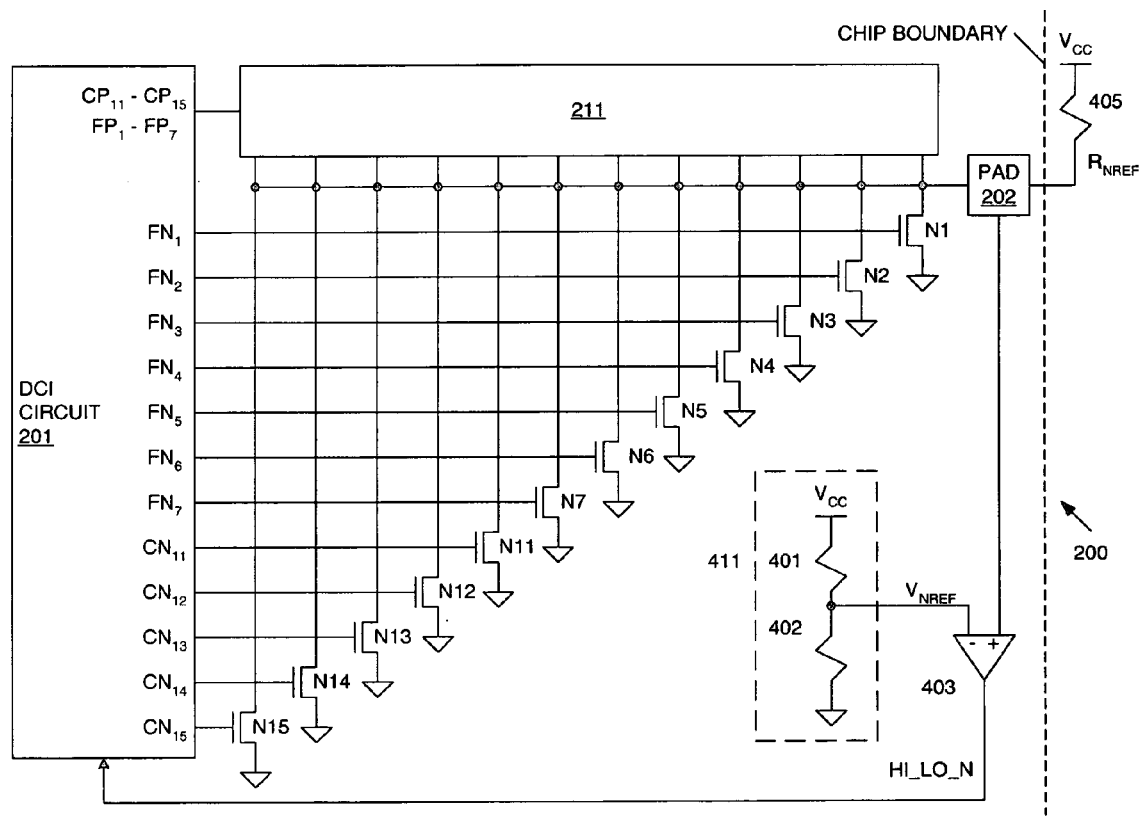
FIG. 8 is a circuit diagram illustrating the general manner in which n-channel transistors of an output driver circuit are matched with an external resistance.

FIG. 8 is a circuit diagram illustrating the general manner in which n-channel transistors N1–N7 and N11–N15 of output driver circuit 200 are matched with an external resistance 405. That is, FIG. 8 illustrates output driver circuit 200 being used as an n-channel reference circuit. As shown in FIG. 8, external resistor 405, having a resistance of $R_{NREF}$, is coupled between pad 202 and the $V_{CC}$ supply terminal. Internally, pad 202 is also coupled to the positive input terminal of comparator 403. The negative input terminal of comparator 403 is coupled to receive a reference voltage $V_{NREF}$ from a reference voltage generator 411. In the described example, reference voltage generator 411 includes a pair of resistors 401–402 connected in series between the $V_{CC}$ supply terminal and the ground terminal. Resistors 401–402 are connected at a common node, which provides the $V_{NREF}$ voltage. In the described example, resistors 401–402 each have a resistance of R ohms. As a result, the reference voltage $V_{NREF}$ has a value of approximately $V_{CC}/$ 2. The voltage on pad 202 will exhibit a voltage of approximately $V_{CC}/2$ when the resistance provided by the turned on n-channel transistors is approximately equal to the resistance $R_{NREF}$ of reference resistor 405.

DCI circuit 201 selects the n-channel transistors to be enabled in the same manner that the p-channel transistors are selected, as described above in connection with FIG. 7. Thus, all of the n-channel transistors N1–N7 and N11–N15 are initially turned off by DCI circuit 201. Fine n-channel transistors N1–N3 are then turned on by DCI circuit 201. If necessary, coarse n-channel transistors N11–N15 are turned on in a binary count order until comparator 403 provides a logic low HI_LO_N output signal. Upon detecting the logic low HI_LO_N output signal, DCI circuit 201 enables the coarse n-channel transistors corresponding with the previous binary count, and makes all further adjustments using the fine n-channel transistors N1–N7.

As described in more detail below, information identifying the enabled transistors in the n-channel reference circuit (FIG. 8) is transmitted to other output driver circuits, such that these other output driver circuits are operated by enabling the same transistors as the n-channel reference circuit. As a result, the output driver circuits will be referenced to external reference resistances. This advantageously optimizes the operation of the output driver circuits.

In another embodiment, instead of the linear search algorithm described above, a binary search algorithm can be used to determine the P or N channel transistors to be turned on.

In accordance with one embodiment, adjustments made by DCI circuit 201 can be dynamically enabled or disabled. For example, after DCI circuit 201 has determined which coarse and fine p-channel transistors should be turned on, and which coarse and fine n-channel transistors should be turned on, DCI circuit 201 can be prevented from making further changes to the enabled/disabled transistors. Thus, if DCI circuit 201 initially determines that p-channel transistors P1–P3, P13 and P15 should be turned on, then further adjustments by DCI circuit 201 can be disabled, thereby causing this p-channel determination to be used, without change, until the DCI circuit 201 is re-enabled.

In the embodiment described above, both of the reference voltages $V_{PREF}$ and $V_{NREF}$ have a value of approximately $V_{CC}/2$, thereby causing the p-channel transistors to be referenced to reference resistance 305 ($R_{PREF}$) and the n-channel transistors to be referenced to reference resistance 405 ($R_{NREF}$). In another embodiment, the reference voltages $V_{PREF}$ and $V_{NREF}$ can be modified to have values of approximately $2V_{CC}/3$ and $V_{CC}/3$, respectively. This effectively references the p-channel transistors to ½ of the reference resistance 305 ($R_{PREF}$), and references the n-channel transistors to ½ of the reference resistance 405 ($R_{NREF}$). In other embodiments, the reference voltages $V_{PREF}$ and $V_{NREF}$ can be modified to have other values, such that the turned on transistors will have different relationships with respect to the reference resistors 305 and 405. This advantageously allows reference resistors having different values to be used.

In another embodiment, external reference resistor 405 can be eliminated. In this embodiment, the reference resistance for the n-channel reference circuit is provided by turning on the p-channel transistors 211 determined by the p-channel reference circuit in response to reference resistor 305. Thus, if the p-channel reference circuit determines that coarse p-channel transistors P13 and P15 and fine p-channel transistors P1–P4 must be turned on to provide the desired correspondence with reference resistor 305, then these transistors P1–P4, P13 and P15 are turned on in the n-channel reference circuit. The n-channel reference circuit then determines which n-channel transistors 212 should be turned on to correspond with the turned on p-channel transistors in the output driver circuit. In this manner, the n-channel transistors 212 turned on by the n-channel reference circuit are indirectly referenced to the external reference resistance $R_{PREF}$ 305.

In a similar manner, external reference resistor 305 can be eliminated. In this embodiment, the n-channel reference circuit determines which n-channel transistors should be turned on in response to the external reference resistance 405 ($R_{NREF}$). This information is then transmitted to the p-channel reference circuit, such that the same n-channel transistors are turned on in the p-channel reference circuit. The p-channel reference circuit then determines which p-channel transistors should be turned on to correspond with the turned on n-channel transistors. In this manner, the p-channel transistors turned on by the p-channel reference circuit are indirectly referenced to the external reference resistance 405.

Figure 9A:
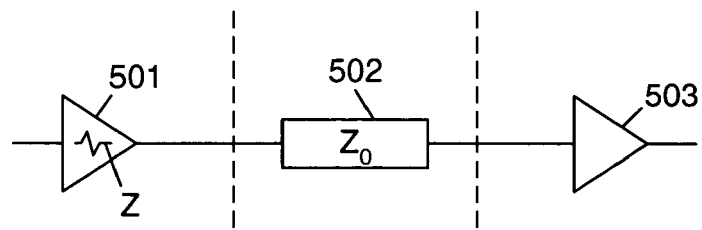
FIG. 9A is a circuit diagram illustrating a digitally controlled impedance (DCI) output driver circuit that has a digitally controlled impedance.

As described above, adjusting the p-channel and n-channel transistors to be enabled in an output driver circuit in response to reference resistances advantageously enables the output driver circuit to exhibit a particular resistance with respect to reference resistors. An output driver circuit that is adjusted in this manner will be referred to as a digitally controlled impedance (DCI) output driver circuit. FIG. 9A is a circuit diagram illustrating a DCI output driver circuit 501 that has a digitally controlled impedance Z. Impedance Z is selected to correspond with the impedance $Z_0$ of a line 502 located between the DCI driver circuit 501 and a receiver circuit 503.

Figure 9B:
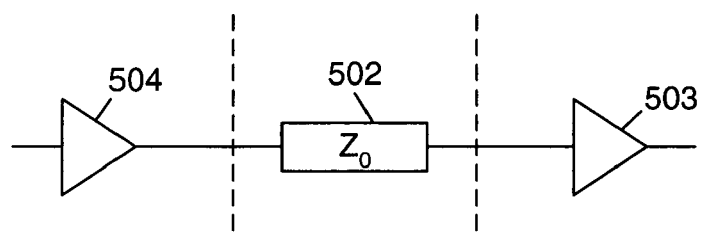
FIG. 9B is a circuit diagram illustrating an output driver circuit in which a DCI circuit has been bypassed.

In another embodiment, DCI circuit 201 is bypassed, such that some or all of the p-channel transistors 211 are turned on to provide a logic high output signal, and some or all of the n-channel transistors 212 are turned on to provide a logic low output signal. FIG. 9B is a circuit diagram illustrating an output driver circuit 504 in which DCI circuit 201 has been bypassed. Although output driver circuit 504 will exhibit an impedance, this impedance is not controlled to have a particular correspondence with the impedance $Z_0$ of line 502.

DCI circuit 201 can also be controlled to turn on user-selected p-channel transistors to provide a logic high output signal, and to turn on user-selected n-channel transistors to provide a logic low output signal. For example, DCI circuit 201 can be controlled to turn on only the coarse p-channel transistors P11–P15 to provide a logic high output signal, and to turn on only the coarse n-channel transistors N11–N15 to provide a logic low output signal, regardless of the external impedance $Z_0$. This alternative is described in more detail by Goetting et al. in commonly owned U.S. Pat. No. 5,877,632, entitled "FPGA with a Plurality of I/O Voltage Levels" which is hereby incorporated by reference.

Figure 10A:
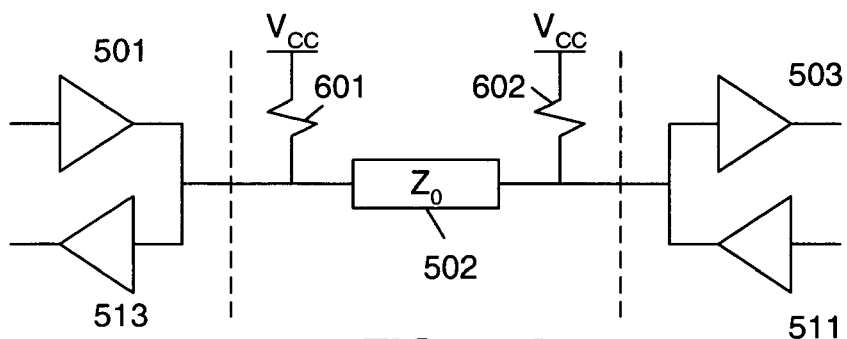
FIG. 10A is a circuit diagram illustrating external termination resistors, which are coupled between the ends of a line and a $V_{CC}$ supply voltage terminal.

In addition to controlling the turned on transistors of output driver circuit 200 to correspond with an external impedance $Z_0$, DCI circuit 201 can be controlled to provide a transmission line termination resistance. As illustrated in FIG. 10A, it is common to provide external termination resistors 601–602, which are coupled between the ends of line 502 and a $V_{CC}$ supply voltage terminal. In FIG. 10A, output driver circuit 501 is coupled to an input buffer 513 at one end of line 502, thereby providing an input/output I/O configuration. Similarly, input buffer 503 is coupled to output driver circuit 511 at the other end of line 502.

Figure 10B:
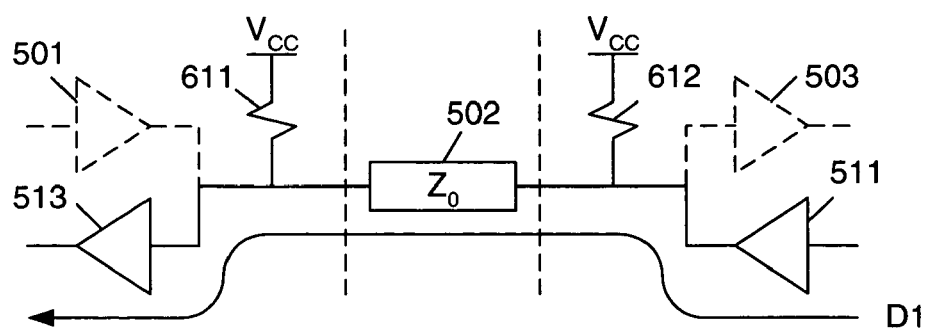
FIGS. 10B and 10C are circuit diagrams illustrating termination resistors that are implemented using the digitally controlled impedances of output driver circuits, thereby eliminating the need for external termination resistors.
Figure 10C:
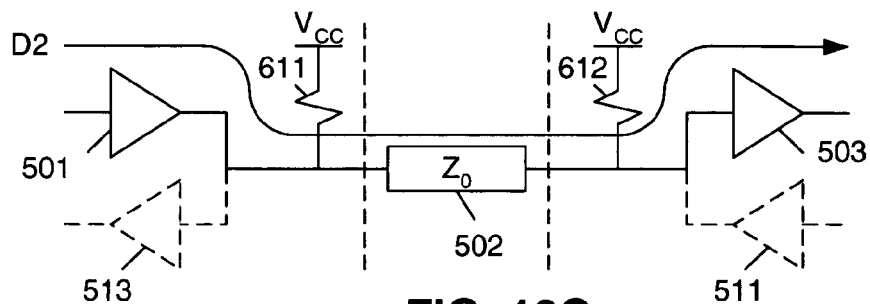

As illustrated in FIGS. 10B and 10C, termination resistors 611 and 612 can be implemented using the digitally controlled impedance of output driver circuits 501 and 511, respectively, thereby eliminating the need for external termination resistors 601 and 602. To determine the p-channel transistors to be turned on to implement termination resistors 611 and 612, the DCI circuits in output driver circuits 501 and 511 are referenced to a known resistance in response to reference voltages $V_{PREF}$ and $V_{NREF}$ having values of approximately $V_{CC/2}$ and $V_{CC}/2$, respectively. Advantageously, the termination resistance is controlled with respect to external reference resistors and can be adjusted for changes in temperature, voltage and/or process.

Within output driver circuits 501 and 511, a user-selected set of p-channel transistors is used to drive a logic high output signal. For example, the coarse p-channel transistors P11–P15 may be selected to drive a logic high output signal in response to a corresponding input data signal. In this example, a subset of the fine p-channel transistors P1–P7 is selected to provide the termination resistance. While the coarse p-channel transistors are only turned on to drive a logic high output signal, the selected subset of the fine p-channel transistors P1–P7 are turned on at all times to provide the desired termination resistance. In other embodiments, other combinations of coarse and fine transistors can be used to serve as the user-selected transistors and the termination transistors.

FIG. 10B illustrates a signal D1 being driven from output driver 511 to input buffer 513. At this time, output driver 511 is configured in a manner described above. That is, output driver 511 provides logic high and low output signals by turning on user-selected transistors (e.g., all coarse p-channel transistors or all coarse n-channel transistors). In addition, a second set of p-channel transistors in driver circuit 511 are turned on to implement termination resistor 612. A tri-state signal applied to output driver circuit 501 is asserted, such that this output driver circuit 501 is not responsive to signals applied to its input terminal. However, the set of p-channel transistors in output driver circuit 501 that have been selected to implement termination resistor 611 remain turned on. As a result, the desired termination resistances 611 and 612 are provided between line 502 and the $V_{CC}$ supply terminal.

FIG. 10C illustrates a signal D2 being driven from output driver 501 to input buffer 503. At this time, output driver 501 is configured in the same manner as output driver circuit 511 of FIG. 10B, such that this output driver 501 provides logic high and low output signals by turning on user-selected transistors, and provides the termination resistor 611 by turning on the set of p-channel transistors that have been selected to implement this termination resistor. A tri-state signal applied to output driver circuit 511 is asserted, such that this output driver circuit 511 is not responsive to signals applied to its input terminal. However, the set of p-channel transistors in output driver circuit 511 that have been selected to implement termination resistor 612 remain turned on. As a result, the desired termination resistances 611 and 612 are provided between line 502 and the $V_{CC}$ supply terminal. In this manner, output driver circuits 501 and 511 provide termination resistances 611 and 612, respectively, for bi-directional signal transfer on line 502. The terminations illustrated in FIGS. 10B–10C are referred to as single terminations, because a single set of transistors is used to provide each termination.

Figure 11A:
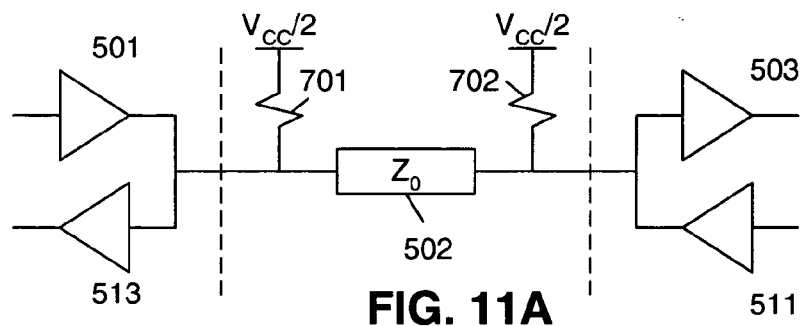
FIG. 11A is a circuit diagram illustrating external termination resistors, which are coupled between the ends of a line and a $V_{CC}/2$ supply voltage terminal.

As illustrated in FIG. 11A, it is also common to provide external termination resistors 701 and 702, which are coupled between the ends of line 502 and a $V_{CC}/2$ supply voltage terminal.

Figure 11B:
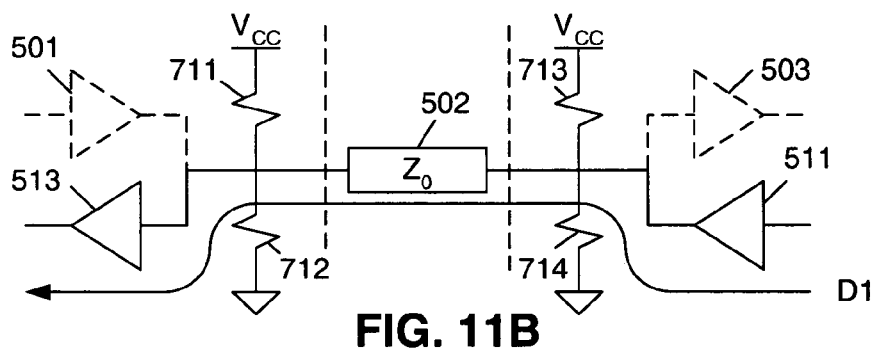
FIGS. 11B and 11C are circuit diagrams of termination resistors that are implemented using the digitally controlled impedances of output driver circuits, thereby eliminating the need for external termination resistors and a $V_{CC}/2$ supply.
Figure 11C:
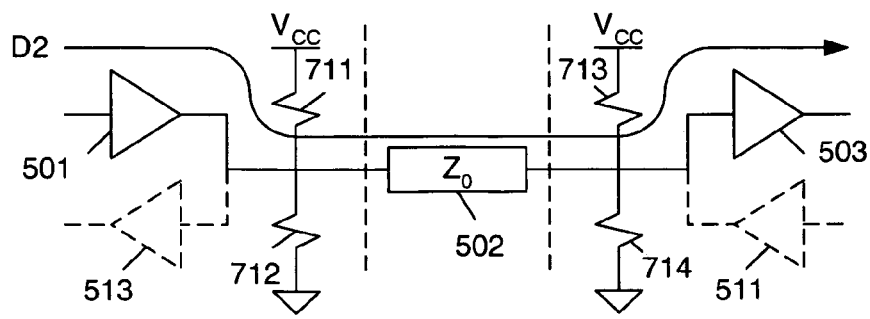

As illustrated in FIGS. 11B and 11C, termination resistors 711–712 and 713–714 can be implemented using the DCI circuits of driver circuits 501 and 511, respectively, thereby eliminating the need for external termination resistors 701 and 702 and the $V_{CC}/2$ power supply. Each of resistors 711–714 is determined to have a resistance that is equal to twice the resistance of resistor 701 (or 702). As a result, resistors 711–712 and 713–714 are the Thevenin equivalents of resistors 701 and 702, respectively.

To determine the p-channel and n-channel transistors to be turned on to implement termination resistors 711–714, the DCI circuits in output driver circuits 501 and 511 are referenced to known resistances in response to reference voltages $V_{PREF}$ and $V_{NREF}$ having values of approximately $2V_{CC}/5$ and $3V_{CC}/5$, respectively. Advantageously, impedance is controlled with respect to external reference resistors and can be adjusted for changes in temperature, voltage and/or process.

FIG. 11B illustrates a signal D1 being driven from output driver 511 to input buffer 513. At this time, output driver 511 is configured in the same manner as output driver circuit 511 of FIG. 10B, such that this output driver 511 provides logic high and low output signals by turning on user-selected transistors, and provides termination resistances 713 and 714 by turning on the p-channel and n-channel transistors that have been determined to provide these desired termination resistances 713 and 714. A tri-state signal applied to output driver circuit 501 is asserted, such that this output driver circuit 501 is not responsive to signals applied to its input terminal. However, the p-channel transistors and the n-channel transistors that have been determined to provide the desired termination resistances 711 and 712 remain turned on in output driver 501. As a result, output driver circuit 501 provides the equivalent of termination resistance 701 coupled between line 502 and a $V_{CC}/2$ supply terminal. Similarly, output driver circuit 511 provides the equivalent of termination resistance 702 between line 502 and a $V_{CC}/2$ supply terminal.

FIG. 11C illustrates a signal D2 being driven from output driver 501 to input buffer 503. At this time, output driver 501 is configured in the same manner as output driver circuit 511 of FIG. 11B, and output driver 511 is configured in the same manner as output driver circuit 501 of FIG. 11B. In this manner, output driver circuits 501 and 511 provide termination resistances 711–712 and 713–714, respectively, for bi-directional signal transfer on line 502.

The terminations illustrated in FIGS. 11B–11C are referred to as split terminations, because two sets of transistors are required to provide each termination.

The variations illustrated in FIGS. 9A–9B, 10A–10C and 11A–11C, as well as the manner of transmitting information from the p-channel and n-channel reference circuits to other output driver circuits, will now be described in more detail.

Figure 12:
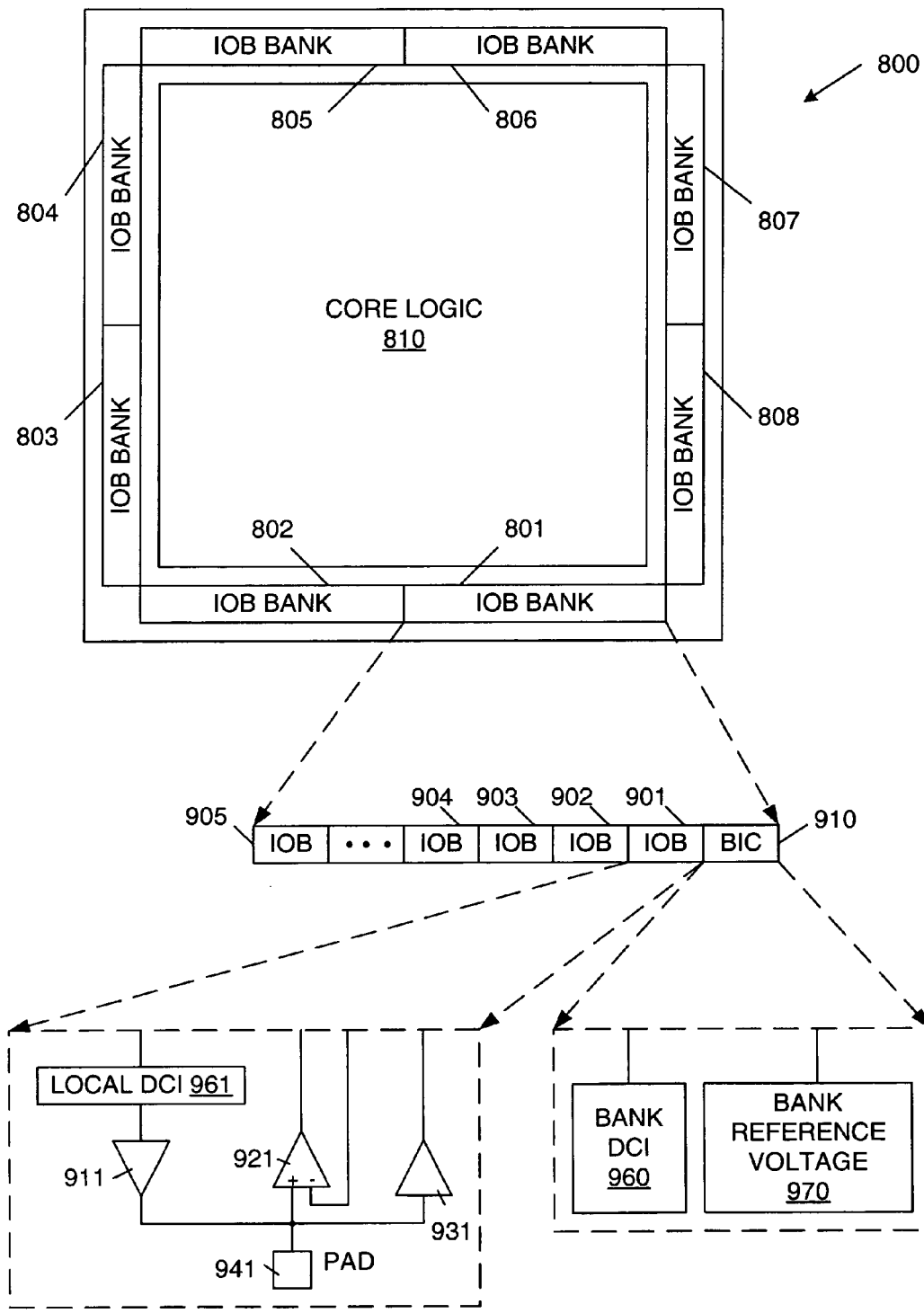
FIG. 12 is a block diagram of an integrated circuit chip.

FIG. 12 is a block diagram of an integrated circuit chip 800. IC chip 800 includes eight input/output block (IOB) banks 801–808 and core logic 810. IOB banks 801–808 are substantially identical. In a particular embodiment, core logic 810 includes an array of configurable logic blocks and programmable interconnect circuitry. However, other core logic is contemplated. In general, IOB banks 801–808 provide an interface between core logic 810 and circuitry external to chip 800.

In the described embodiment, two IOB banks are located along each edge of IC chip 800, with each IOB bank having 20 to 150 IOBs. An exploded view illustrates that IOB bank 801 includes a plurality of IOBs 901–905 and a bank impedance control (BIC) circuit 910. A further exploded view illustrates that IOB 901 includes output driver circuit 911, comparator 921, input buffer circuit 931, I/O pad 941 and local digitally controlled impedance (DCI) circuit 961. Yet another exploded view illustrates that bank impedance control circuit 910 includes a bank digitally controlled impedance (DCI) circuit 960 and bank reference voltage generator 970. As described in more detail below, local DCI circuit 961 and bank DCI circuit 960 combine to perform the functions of DCI circuit 201 (FIGS. 6–8). As also described in more detail below, bank reference voltage generator 970 provides the reference voltages that are used by IOBs 901–905. Thus, bank reference voltage generator 970 performs the functions of reference voltage circuits 311 and 411 (FIGS. 7 and 8).

In another embodiment, only one bank impedance control circuit 910 is provided for the entire chip 800. In this embodiment, bank impedance control circuit 910 provides the necessary control for all of the local DCI circuits on chip 800. In another embodiment, there are multiple bank impedance control circuits, which are capable of controlling one or more IOB banks.

Figure 13:
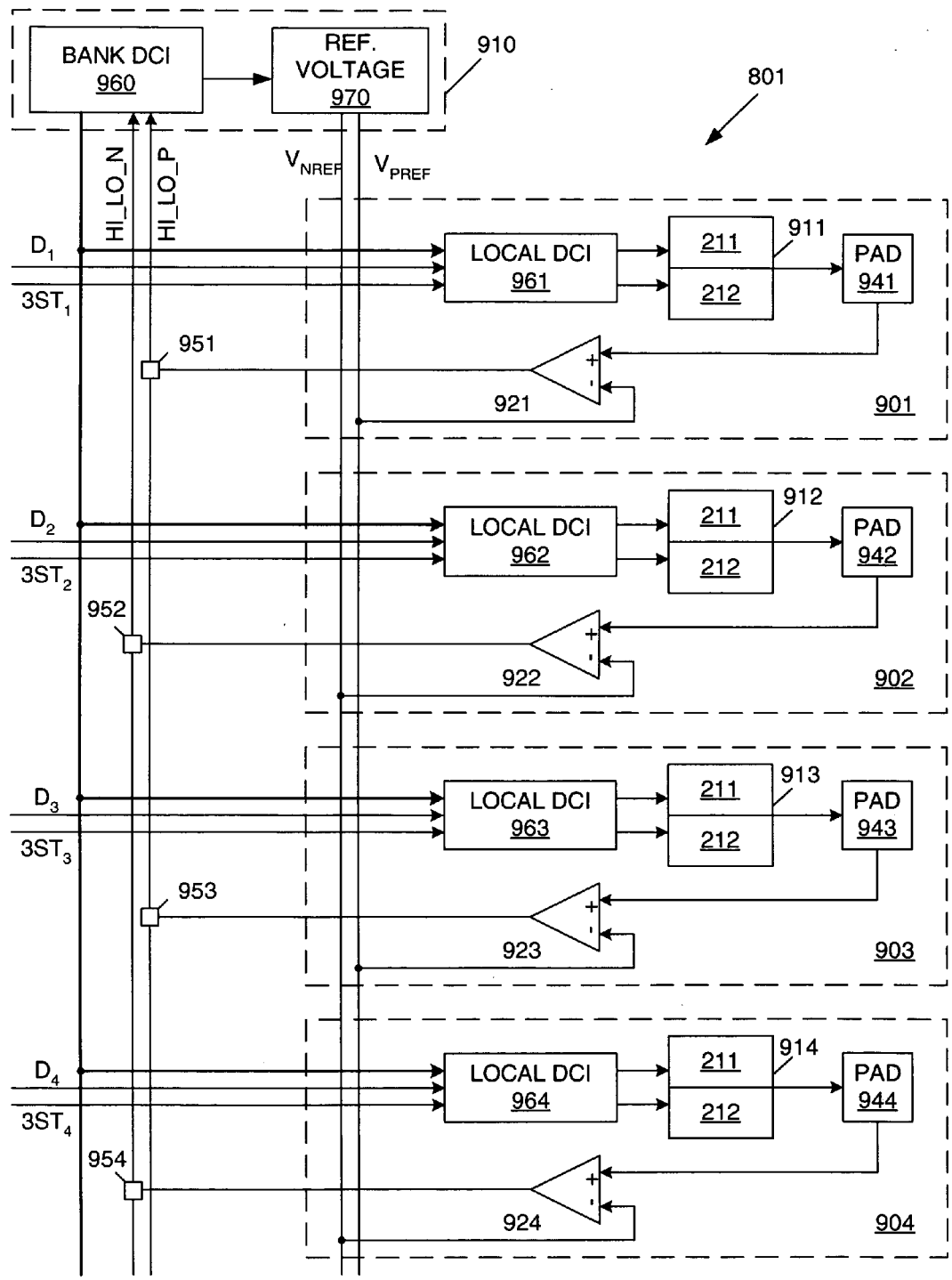
FIG. 13 is a circuit diagram illustrating selected portions of an IOB bank, including a bank impedance control circuit and selected IOBs.

FIG. 13 is a circuit diagram illustrating selected portions of IOB bank 801, including bank impedance control circuit 910 and IOBs 901–904. For simplicity, the input buffer circuits (e.g., input buffer circuit 931) are not shown in FIG. 13. IOBs 901–904 include respective local DCI circuits 961–964, respective output driver circuits 911–914, respective comparators 921–924 and respective I/O pads 941–944. Each of output driver circuits 911–914 includes a set of p-channel transistors 211 and a set of n-channel transistors 212, as described above in connection with FIGS. 6–8.

Reference voltage generator 970 provides the n-channel reference voltage, $V_{NREF}$, and the p-channel reference voltage $V_{PREF}$, on lines that extend through IOB bank 801. The comparator in every odd numbered IOB (e.g., 901, 903, 905) in IOB bank 801 is coupled to receive the $V_{PREF}$ voltage. The comparator in every even numbered IOB (e.g., 902, 904) in IOB bank 801 is coupled to receive the $V_{NREF}$ voltage.

The output terminals of the comparators in odd numbered IOBs are coupled to programmable connections (e.g., 951, 953), which if programmed will connect a corresponding comparator to a common HI_LO_P line. Similarly, the output terminals of the comparators in even numbered IOBs are coupled to programmable connections (e.g., 952, 954), which if programmed will connect a corresponding comparator to a common HI_LO_N line. The HI_LO_P line and the HI_LO_N line are routed to bank DCI circuit 960.

Bank DCI circuit 960 also provides control signals to local DCI circuits 961–964. These control signals will be described in more detail below. In general, IOB bank 801 operates as follows. One of the odd-numbered IOBs is selected to be a p-channel reference circuit, and one of the even-numbered IOBs is selected to be an n-channel reference circuit. This selection is made by setting a configuration memory bit in the local DCI circuit of each of these IOBs, and programming the connection to couple the output terminals of the comparators of these IOBs to the HI_LO_N and HI_LO_P lines. Although any one of the odd-numbered IOBs can be selected to be the p-channel reference circuit, IOB 901 is selected in the described embodiment. Thus, a configuration memory bit in local DCI circuit 961 is set, and programmable connection 951 is enabled. Similarly, although any one of the even-numbered IOBs can be selected to be the n-channel reference circuit, IOB 902 is selected in the described embodiment. Thus, a configuration memory bit in local DCI circuit 962 is set, and programmable connection 952 is enabled.

Because IOB 901 is to serve as the p-channel reference circuit, a predetermined reference resistance $R_{PREF}$ is connected between pad 941 and the ground terminal in the manner illustrated in FIG. 7. As a result, IOB 901 is configured in substantially the same manner illustrated in FIG. 7, except that the DCI circuit 201 of FIG. 7 has been divided into bank DCI circuit 960 and local DCI circuit 961.

Because IOB 902 is to serve as the n-channel reference circuit, a predetermined reference resistance $R_{NREF}$ is connected between pad 942 and an external $V_{CC}$ supply terminal in the manner illustrated in FIG. 8. As a result, IOB 902 is configured in substantially the same manner illustrated in FIG. 8, except that the DCI circuit 201 of FIG. 8 has been divided into bank DCI circuit 960 and local DCI circuit 962.

In general, IOB bank 801 operates as follows. P-channel reference circuit 901 and n-channel reference circuit 902 are initially set to have predetermined turned-on p-channel and n-channel transistors. During a first time period, bank DCI circuit 960 processes the HI_LO_P signal provided by p-channel reference circuit 901. In response, bank DCI circuit 960 instructs local DCI circuit 961 to enable/disable the p-channel transistors in driver circuit 911 in the manner described above in connection with FIG. 7. At the same time, bank DCI circuit 960 also instructs other local DCI circuits to enable/disable the same p-channel transistors as local DCI circuit 961. Thus, when logic low data signals D3–D4 are applied to local DCI circuits 963–964, these local DCI circuits will enable the same p-channel transistors determined by the p-channel reference circuit 901. For example, if bank DCI circuit 960 instructs local DCI circuit 961 in the p-channel reference circuit 901 to enable fine p-channel transistors P1–P4 and coarse p-channel transistor P14, then bank DCI circuit 960 will similarly instruct local DCI circuit 963 to enable fine p-channel transistors P1—P4 and coarse p-channel transistor P14 when data signal D3 has a logic low value.

During a second time period, bank DCI circuit 960 processes the HI_LO_N signal provided by n-channel reference circuit 902. In response, bank DCI circuit 960 instructs local DCI circuit 962 to enable/disable the n-channel transistors in driver circuit 912 in the manner described above in connection with FIG. 8. Bank DCI circuit 960 also instructs other local DCI circuits to enable/disable the same n-channel transistors as local DCI circuit 962. Thus, if bank DCI circuit 960 instructs local DCI circuit 962 in the n-channel reference circuit 902 to enable fine n-channel transistors N1–N2 and coarse n-channel transistor N13, then bank DCI circuit 960 will similarly instruct local DCI circuit 963 to enable fine n-channel transistors N1—N2 and coarse n-channel transistor N13 when data signal D3 has a logic high value.

In accordance with another embodiment, IOB 904 can be configured in a manner different than IOB 903. For example, output driver circuit 913 of IOB 903 can be configured in response to different reference voltages ($V_{NREF}$ and $V_{PREF}$) than output driver circuit 914 of IOB 904. As a result, output driver circuit 913 will exhibit different resistances than output driver circuit 914. This is accomplished by providing different sets of reference voltages with reference voltage supply 970.

Reference voltage supply 970 can be controlled to provide different reference voltages $V_{PREF}$ and $V_{NREF}$ at different times. For example, reference voltage supply 970 can be controlled to provide a first set of reference voltages that are used by p-channel and n-channel reference circuits 901 and 902 to determine the appropriate p-channel and n-channel transistors to be enabled within IOB 903. Reference voltage supply 970 can also be controlled to provide a second set of reference voltages that are used by p-channel and n-channel reference circuits 901 and 902 to determine the appropriate p-channel and n-channel transistors to be enabled within IOB 904. In the described embodiment, reference voltage supply 970 can be controlled to provide up to four sets of reference voltages. By providing different reference voltages, the on-resistances of different output driver circuits can be controlled to have different values, even though the resistances of the external reference resistors 305 and 405 remain constant. Bank DCI circuit 960 is able to address the local DCI circuits 961–964, such that the appropriate information is provided to the appropriate IOBs.

Figure 14:
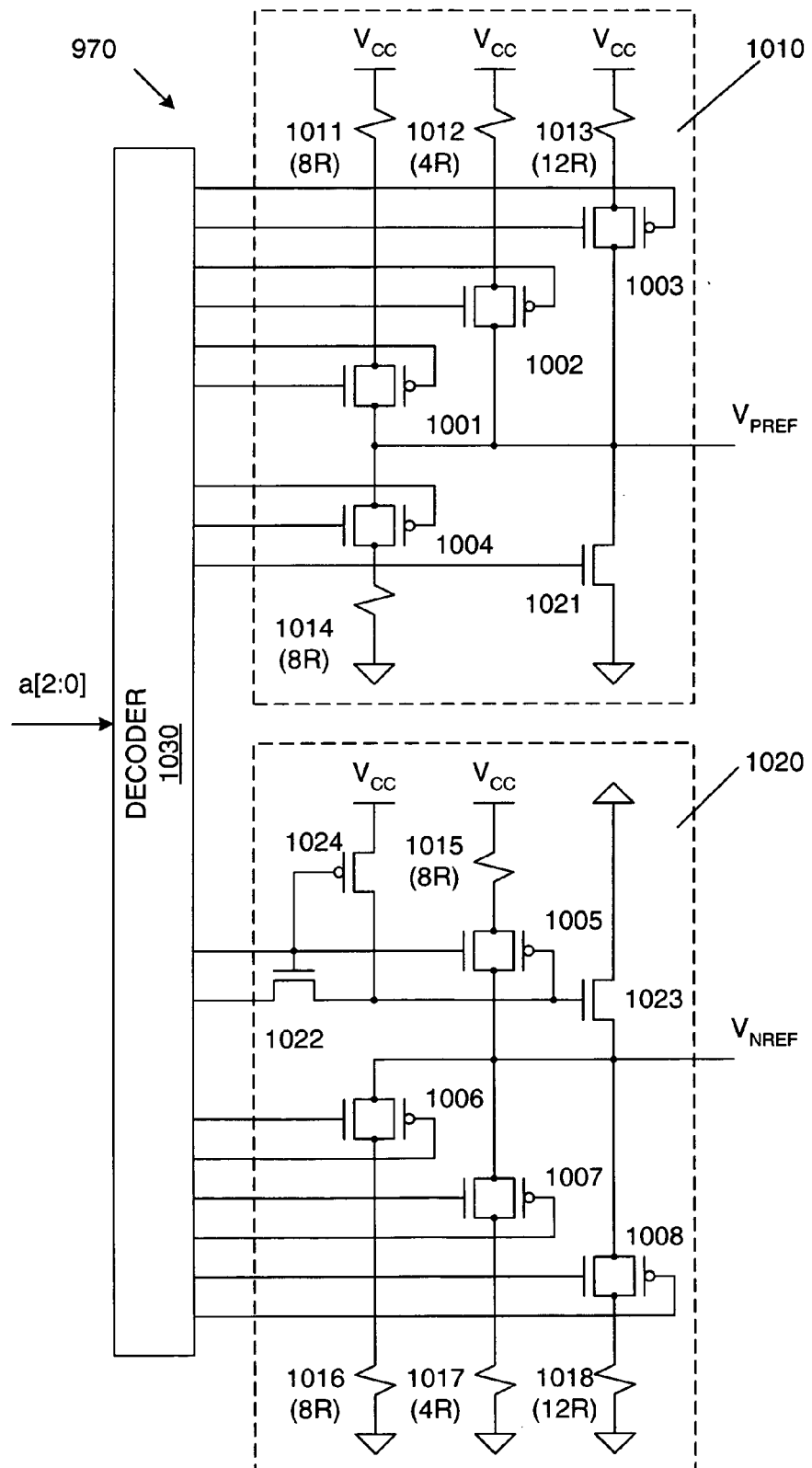
FIG. 14 is a circuit diagram of a reference voltage supply.

FIG. 14 is a circuit diagram of reference voltage supply 970. Reference voltage supply 970 includes p-channel reference voltage generator 1010, n-channel reference voltage generator 1020 and decoder circuit 1030. P-channel reference voltage generator 1010 includes transmission gates 1001–1004, resistors 1011–1014 and n-channel transistor 1021. Resistors 1011, 1012, 1013 and 1014 have relative resistances of R, 4R, 12R and 8R, respectively. N-channel reference voltage generator 1020 includes transmission gates 1005–1008, resistors 1015–1018, n-channel transistors 1022–1023 and p-channel transistor 1024. Resistors 1015, 1016, 1017 and 1018 have relative resistances of 8R, 8R, 4R and 12R, respectively. Decoder circuit receives address signals a[2:0] from bank DCI circuit 960, and in response, provides control signals to transmission gates 1001–1008 and transistors 1021–1023. Table 1 summarizes the status of transmission gates 1001–1004, transistor 1021 and the p-channel reference voltage $V_{PREF}$ for the various address signals a[2:0]

TABLE 1

| a[2:0] | 1001 | 1002 | 1003 | 1004 | 1021 | $V_{PREF}$ |
|---|---|---|---|---|---|---|
| 000 | OFF | OFF | OFF | OFF | ON | 0 |
| 101 | | | | | | |
| 110 | | | | | | |
| 111 | | | | | | |
| 001 | ON | OFF | OFF | ON | OFF | $V_{CC}/2$ |
| 010 | OFF | ON | OFF | ON | OFF | $2V_{CC}/3$ |
| 011 | ON | OFF | OFF | ON | OFF | $V_{CC}/2$ |
| 100 | OFF | OFF | ON | ON | OFF | $2V_{CC}/5$ |

Table 2 summarizes the status of transmission gates 1005–1008, transistor 1022–1024 and the n-channel reference voltage $V_{NREF}$ for the various address signals a[2:0]

TABLE 2

| a[2:0] | 1005 1022 | 1006 | 1007 | 1008 | 1023 1024 | $V_{NREF}$ |
|---|---|---|---|---|---|---|
| 000 | OFF | OFF | OFF | OFF | ON | 0 |
| 101 | | | | | | |
| 110 | | | | | | |
| 111 | | | | | | |
| 001 | ON | ON | OFF | OFF | OFF | $V_{CC}/2$ |
| 010 | ON | OFF | ON | OFF | OFF | $V_{CC}/3$ |
| 011 | ON | ON | OFF | OFF | OFF | $V_{CC}/2$ |
| 100 | ON | OFF | OFF | ON | OFF | $3V_{CC}/5$ |

Addresses of "001" or "010" are used to provide DCI output driver circuits with different impedances (FIG. 9A). An address of "011" is used to provide a single termination pull-up to $V_{CC}$ (FIG. 10B). An address of "100" is used to provide a split termination to $V_{CC}$ and ground (FIG. 11B).

Figure 15:
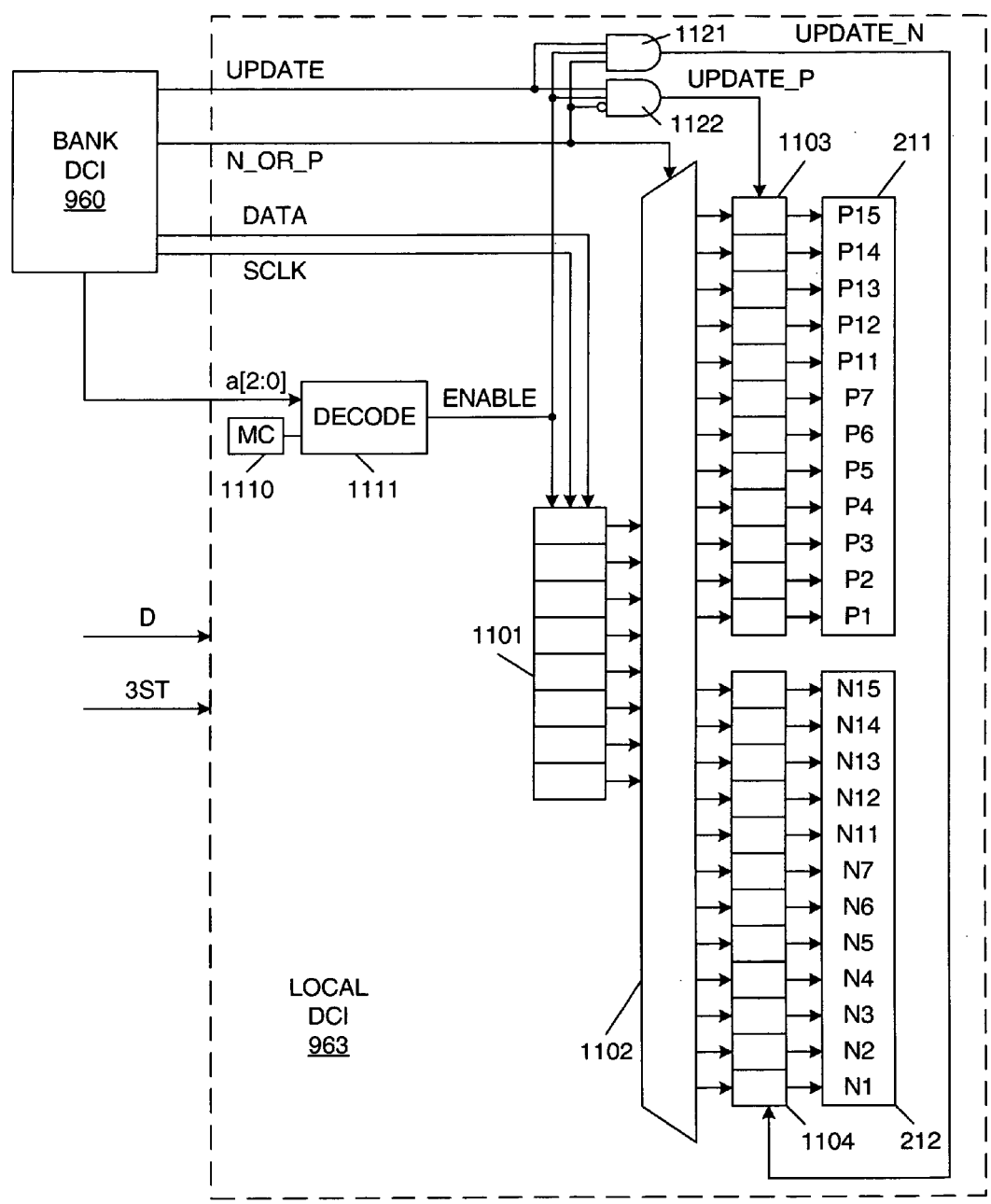
FIG. 15 is a block diagram illustrating a bank DCI circuit and a local DCI circuit.

FIG. 15 is a block diagram illustrating bank DCI circuit 960 and local DCI circuit 963 in more detail. Local DCI circuits 961–962 and 964 are identical to local DCI circuit 963.

Local DCI circuit 963 includes shift register 1101, data decoder 1102, p-channel register 1103, n-channel register 1104, configuration memory cells 1110, address decoder 1111 and logical AND gates 1121–1122. Bank DCI circuit 660 and local DCI circuit 663 operate as follows.

Configuration memory cells 1110 store four configuration bits. One of these configuration bits indicates whether 10B 903 will serve as a reference 10B. If this configuration bit is set, then address decoder 1111 will assert an ENABLE signal regardless of the state of the applied address signal a[2:0]. The remaining three configuration bits identify a "type" of the output driver circuit 913 (assuming that IOB 903 is not a reference IOB). There are five "types" of output driver circuits in accordance with the described embodiment. Table 3 defines the reference voltages used for each of the five types. Note that the contents of configuration memory cells 1110 will correspond with one of the address signals a[2:0].

TABLE 3

| Type Configuration Memory Cells 1110 | $V_{PREF}$ | $V_{NREF}$ |
|---|---|---|
| 000, 101, 110, 111 | 0 | 0 |
| 001 | $V_{CC}/2$ | $V_{CC}/2$ |
| 010 | $V_{CC}/3$ | $2V_{CC}/3$ |
| 011 | $V_{CC}/2$ | $V_{CC}/2$ |
| 100 | $3V_{CC}/5$ | $2V_{CC}/5$ |

If the address signal a[2:0] from bank DCI circuit 960 matches the contents of configuration memory cells 1110, then address decoder 1111 will assert an ENABLE signal, thereby enabling shift register 1101. In response to this ENABLE signal (and a SCLK clock signal provided by bank DCI circuit 960), shift register 1101 will sequentially shift in the DATA signal provided by bank DCI circuit 960. The DATA signal identifies the p-channel transistors 211 or the n-channel transistors 212 to be turned on during the present iteration. Shift register 1101 provides the loaded DATA values to data decoder 1102.

Bank DCI circuit 960 provides a N_OR_P control signal to data decoder 1102, thereby indicating whether the contents of shift register 1101 are intended to control the p-channel transistors 211 (N_OR_P=0), or the n-channel transistors 212 (N_OR_P=1) of output driver circuit 913. Bank DCI circuit 960 initially provides a N_OR_P signal having a logic "0" value. In response, data decoder 1102 will decode the contents of shift register 1101, and transmit the results to p-channel register 1103.

Bank DCI circuit 960 then asserts a logic high UPDATE signal, which causes AND gate 1121 to assert a logic high UPDATE_P signal. In response, p-channel register 1103 loads the results provided by data decoder 1102. The contents of p-channel register 1103 are then used to control p-channel transistors P1–P7 and P11–P15 in the manner described above.

Data decoder 1102 operates as follows. Data decoder receives the 8-bit signal D[7:0] received from shift register 1101. The D[7:0] signal includes five bits D[7:3] to control coarse transistors (i.e., coarse p-channel transistors P11–P15 or coarse n-channel transistors N11–N15). These five bits D[7:3] are routed directly through decoder 1102 to either register 1103 or 1104 in response to the N_OR_P signal. The D[7:0] signal also includes three bits D[2:0] to control fine transistors (i.e., fine p-channel transistors P1–P7 or fine n-channel transistors N1–N7). Decoder 1102 provides signals that will turn on 0 to 7 of the fine transistors in response to the D[2:0] bits.

The operation of IOB bank 801 will now be summarized. First, one of IOBs 901–905 is configured as a p-channel reference circuit, and another one of IOBs 901–905 is configured as an n-channel reference circuit. The remaining IOBs are configured to have a particular 'type' (e.g., a first type, a second type, etc.) by appropriately programming the configuration memory cells 1110 within the IOBs.

Bank DCI circuit 960 then asserts a first address signal $a_1[2:0]$ (e.g., "001") and a first data signal $D_1[7:0]$. The first address signal $a_1[2:0]$ causes reference voltage circuit 970 to generate a first pair of reference voltages $V_{PREF1}$ and $V_{NREF1}$ (e.g., $V_{CC}/2$ and $V_{CC}/2$) The first data signal $D_1[7:0]$, which identifies p-channel transistors to be enabled, is latched into the p-channel reference IOB. The first address signal $a_1[2:0]$ also causes the first data signal $D_1[7:0]$ to be latched into all of the IOBs of the first type.

The bank DCI circuit 960 then provides a logic low N_OR_P signal and a logic high UPDATE signal, thereby causing the first data signal $D_1[7:0]$ to be decoded and used to control the p-channel transistors in both the p-channel reference circuit and the IOBs of the first type. In response, the p-channel reference circuit provides a HI_LO_P signal having a logic high or low value to bank DCI circuit 960. This process is repeated until the p-channel reference circuit has provided the desired p-channel settings to all of the IOBs of the first type.

The address signal a[2:0] is then incremented to the second type ("010"), such that the reference voltage circuit 970 generates a second pair of reference voltages. In response, the p-channel reference circuit is used to provide the desired p-channel settings to all of the IOBs of the second type.

This process is repeated such that the desired p-channel settings are provided for all of the different types of IOBs. The n-channel reference circuit is then used to provide the desired n-channel settings for the different types of IOBs.

To provide the desired settings for the n-channel transistors, bank DCI circuit 960 asserts the first address signal $a_1[2:0]$ and then provides a data signal $D_2[7:0]$. This data signal $D_2[7:0]$, which identifies n-channel transistors to be enabled, is latched into the n-channel reference circuit. The first address signal $a_1[2:0]$ also enables the second data signal $D_2[7:0]$ to be latched into all of the IOBs of the first type.

The bank DCI circuit 960 then provides a logic high N_OR_P signal and a logic high UPDATE signal, thereby causing the data signal $D_2[7:0]$ to be decoded and used to control the n-channel transistors in both the n-channel reference circuit and the IOBs of the first type. In response, the n-channel reference IOB provides a HI_LO_N signal having a logic high or low value to bank DCI circuit 960. This process is repeated until the n-channel reference circuit has provided the desired n-channel settings to all of the IOBs of the first type.

The address signal a[2:0] is then incremented to the second type ("010"), such that the reference voltage circuit 970 generates a second pair of reference voltages. In response, the n-channel reference circuit is used to provide the desired n-channel settings to all of the IOBs of the second type.

This process is repeated such that the desired n-channel settings are provided for all of the different types of IOBs. The process then repeats, with the p-channel transistor settings being updated for the various types, and then the n-channel transistor settings being updated for the various types. In this manner, the p-channel and n-channel determinations are continuously being updated for each type during operation of the chip.

Note that IOBs can be excluded from this process by programming the configuration memory cells 1110 to store a 3-bit value of "000", "101", "110" or "111". In this case, the p-channel and n-channel transistors to be enabled are determined by the user programming configuration memory cells.

Though connection with the control of output driver circuits has been described, it is understood that the DCI may be applied to circuits which do not drive output signals. For example, selection of which parallel-connected transistors should be turned on between any node and a voltage supply terminal may be done. In addition, the DCI block 201 can be implemented as a state machine. In addition, although p-channel transistors have been used as pull-up elements, and n-channel transistors have been used as pull-down elements, n-channel transistors can be used as pull-up elements and p-channel transistors can be used as pull-down elements in other embodiments.

While the foregoing is directed to several embodiments of the invention, other and further embodiments of the invention may be devised without departing from the basic scope thereof, and the scope thereof is determined by the claims that follow.

What is claimed is:

1. A bidirectional transceiver comprising:
 a reference voltage;
 a comparator having first and second input terminals and an output terminal;
 a plurality of pullup devices;
 a plurality of pulldown devices; and
 a control circuit for controlling the plurality of pullup devices and the plurality of pulldown devices;
 wherein the first input terminal of the comparator is coupled to an output terminal of the transceiver;
 wherein the plurality of pullup devices is coupled to the output terminal of the transceiver;
 wherein the plurality of pulldown devices is coupled to the output terminal of the transceiver;
 wherein the reference voltage is coupled to the second input terminal of the comparator;
 wherein the output terminal of the comparator is coupled to the control circuit;
 wherein the control circuit selectively enables a subset of the plurality of pullup devices based on output of the comparator for transmitting a logic high;
 wherein the control circuit comprises at least one configuration memory cell for selectively designating the transceiver as a reference transceiver; and
 wherein the output terminal of the comparator is coupled to an input terminal of the transceiver.

2. The bidirectional transceiver of claim 1, wherein impedance of the subset of the plurality of pullup devices corresponds to impedance at the output of the transceiver.

3. The bidirectional transceiver of claim 2, wherein the control circuit selectively enables a subset of the plurality of pulldown devices based on output of the comparator for transmitting a logic low.

4. The bidirectional transceiver of claim 1, wherein each of the plurality of pullup devices comprises a PMOS transistor, and each of the plurality of pulldown devices comprises an NMOS transistor.

5. The bidirectional transceiver of claim 1, wherein the plurality of pullup devices comprises a plurality of coarse pullup devices and a plurality of fine pullup devices.

6. The bidirectional transceiver of claim 1, further comprising a reference impedance coupled to the output terminal of the transceiver.

7. The bidirectional transceiver of claim 5, wherein the reference impedance is a reference resistor.

8. The bidirectional transceiver of claim 1 further comprising a voltage divider for providing the reference voltage.

9. The bidirectional transceiver of claim 1, wherein a subset of the plurality of pullup devices provides the reference voltage.

10. A method for bidirectional communication comprising:
  applying a reference impedance at an output node of a transceiver;
  comparing voltage of the output node of the transceiver with a reference voltage;
  adjusting impedance of the transceiver for transmitting data based on the comparing;
  providing an input at an input node of the transceiver based on the comparing; and
  selectively designating the transceiver as a reference transceiver based on state of at least one configuration memory cell.

11. The method of claim 10, wherein the transceiver comprises a plurality of pullup devices, and wherein the step of adjusting comprises:
  determining a subset of pullup devices of the plurality of pullup devices that is selectively enabled to transmit a logic high.

12. The method of claim 11, wherein the digitally controlled impedance buffer further comprises a plurality of pulldown devices, and wherein the step of adjusting further comprises:
  determining a subset of pulldown devices of the plurality of pulldown devices that is selectively enabled to transmit a logic low.

13. The method of claim 11, wherein the step of determining the subset of pullup devices comprises:
  enabling a pullup device of the plurality of pullup devices;
  comparing voltage of the output node of the transceiver with the reference voltage; and
  if voltage of the output node is less than the reference voltage, then enabling additional pullup devices of the plurality of pullup devices and comparing voltage of the output node of the transceiver with the reference voltage until voltage of the output node of the transceiver is greater than the reference voltage.

14. The method of claim 13, further comprising disabling the last-added pullup device.

15. The method of claim 13, wherein the step of enabling additional pullup devices of the plurality of pullup devices comprises enabling the additional pullup devices in a binary count order.

16. A system for bidirectional communication comprising:
  a first device having a first bidirectional transceiver, the first bidirectional transceiver comprising:
    a first reference voltage;
    a first comparator having first and second input terminals and an output terminal;
    a plurality of pullup devices;
    a plurality of pulldown devices; and
    a control circuit for controlling the plurality of pullup devices and the plurality of pulldown devices;
    wherein the first input terminal of the first comparator is coupled to an output terminal of the first bi-directional transceiver;
    wherein the plurality of pullup devices is coupled to the output terminal of the first bi-directional transceiver;
    wherein the plurality of pulldown devices is coupled to the output terminal of the first bi-directional transceiver;
    wherein the first reference voltage is coupled to the second input terminal of the first comparator;
    wherein the output terminal of the first comparator is coupled to the control circuit; and
    wherein the output terminal of the first comparator is coupled to provide an input to the first device; and
  a second device having a second bi-directional transceiver, the second bi-directional transceiver comprising:
    a second reference voltage; and
    a second comparator having first and second input terminals;
  wherein the second reference voltage is coupled to the second input terminal of the second comparator;
  wherein the output terminal of the first bidirectional transceiver is coupled to the first input terminal of the second comparator;
  wherein the control circuit selectively enables a subset of the plurality of pullup devices based on output of the first comparator for transmitting a logic high from the first bidirectional transceiver to the second bidirectional transceiver;
  wherein the control circuit selectively enables a subset of the plurality of pulldown devices based on output of the first comparator for transmitting a logic low from the first bi-directional transceiver to the second bi-directional transceiver; and
  wherein the control circuit comprises at least one configuration memory cell for selectively designating the first bi-directional transceiver as a reference transceiver.

17. The system of claim 16, wherein at least one of the first and second devices is a programmable device.

18. The system of claim 17, wherein the programmable device is a field programmable gate array.

* * * * *